(12) United States Patent (10) Patent No.: US 9,343,373 B2
Manabe (45) Date of Patent: May 17, 2016

(54) SEMICONDUCTOR DEVICE INCLUDING WORK FUNCTION ADJUSTING ELEMENT, AND METHOD OF MANUFACTURING THE SAME

(71) Applicant: Kenzo Manabe, Kanagawa (JP)

(72) Inventor: Kenzo Manabe, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 41 days.

(21) Appl. No.: 13/914,956

(22) Filed: Jun. 11, 2013

(65) Prior Publication Data
US 2013/0280872 A1 Oct. 24, 2013

Related U.S. Application Data

(62) Division of application No. 13/195,396, filed on Aug. 1, 2011, now abandoned.

(30) Foreign Application Priority Data

Aug. 2, 2010 (JP) .................................. 2010-173478
Mar. 30, 2011 (JP) .................................. 2011-076787

(51) Int. Cl.
*H01L 21/8238* (2006.01)
*H01L 21/28* (2006.01)
*H01L 27/092* (2006.01)
(Continued)

(52) U.S. Cl.
CPC .. *H01L 21/823835* (2013.01); *H01L 21/28185* (2013.01); *H01L 21/823857* (2013.01); *H01L 27/092* (2013.01); *H01L 29/4966* (2013.01); *H01L 29/51* (2013.01); *H01L 29/513* (2013.01); *H01L 29/7833* (2013.01); *H01L 29/517* (2013.01); *H01L 29/665* (2013.01)

(58) Field of Classification Search
USPC ......................................... 438/216, 261, 591
IPC ................................................ H01L 21/823857
See application file for complete search history.

(56) References Cited

U.S. PATENT DOCUMENTS 7,781,848 B2 8/2010 Ito et al.
7,791,149 B2 9/2010 Boescke
(Continued)

FOREIGN PATENT DOCUMENTS

JP 2009-239080 A 10/2009

OTHER PUBLICATIONS

Kunihiko Iwamoto et al., "Experimental Evidence for the Flatband Voltage Shift of High-K Metal-Oxide-Semiconductor Devices Due to the Dipole Formation at the High-K/SiO2 Interface", Applied Physics Letters, Apr. 1, 2008, pp. 132907-1 to 132907-3, vol. 92.

*Primary Examiner* — Eugene Lee
(74) *Attorney, Agent, or Firm* — Sughrue Mion, PLLC

(57) ABSTRACT

A semiconductor device has a substrate; and an N-channel MIS transistor and a P-channel MIS transistor provided on the same substrate; each of the N-channel MIS transistor and the P-channel MIS transistor having a Hf-containing, high-k gate insulating film, and a gate electrode provided over the high-k gate insulating film, the N-channel MIS transistor having a silicon oxide film or a silicon oxynitride film, which contains a first work function adjusting element, provided between the substrate and the high-k gate insulating film, and, the P-channel MIS transistor having a silicon oxide film or a silicon oxynitride film, which contains the first work function adjusting element same as that contained in the N-channel MIS transistor, provided between the high-k gate insulating film and the gate electrode.

8 Claims, 34 Drawing Sheets

(51) Int. Cl.
*H01L 29/49* (2006.01)
*H01L 29/51* (2006.01)
*H01L 29/78* (2006.01)
*H01L 29/66* (2006.01)

(56) References Cited

U.S. PATENT DOCUMENTS

| | | | |
|---|---|---|---|
| 7,952,118 B2 | 5/2011 | Jung et al. | |
| 2009/0014809 A1* | 1/2009 | Sekine et al. | 257/369 |
| 2009/0026557 A1 | 1/2009 | Yamaguchi | |
| 2009/0179281 A1 | 7/2009 | Zhu et al. | |
| 2009/0212371 A1 | 8/2009 | Kobayashi | |
| 2009/0242970 A1 | 10/2009 | Shimizu et al. | |
| 2010/0044804 A1 | 2/2010 | Chen | |
| 2010/0171187 A1* | 7/2010 | Andreoni et al. | 257/411 |
| 2010/0187612 A1* | 7/2010 | Ikeno et al. | 257/369 |
| 2010/0264495 A1* | 10/2010 | Mo et al. | 257/369 |
| 2011/0193180 A1 | 8/2011 | Chen et al. | |
| 2012/0049297 A1 | 3/2012 | Takeoka | |

* cited by examiner

SEMICONDUCTOR DEVICE INCLUDING WORK FUNCTION ADJUSTING ELEMENT, AND METHOD OF MANUFACTURING THE SAME

This application is a Divisional of U.S. patent application Ser. No. 13/195,396, filed on Aug. 1, 2011, which claims priority from Japanese patent application Nos. 2010-173478, filed Aug. 2, 2010, and 2011-076787, filed Mar. 30, 2011, the contents of all of which are incorporated herein by reference in their entirety.

BACKGROUND

1. Technical Field

The present invention relates to a semiconductor device and a method of manufacturing the same.

2. Related Art

In development of advanced CMOS (complementary MOS) devices having transistors being more and more shrunk in size, degradation of drive current due to depletion of polysilicon electrodes has been noticed as a problem. Techniques for avoiding depletion of the electrodes, through adoption of a metal gate electrode, has therefore been discussed. Pure metals, metal nitrides and silicides have been investigated as materials for composing the metal gate electrode. In any case, threshold voltage ($V_{th}$) of each of N-type MOSFET and P-type MOSFET needs be adjustable to an appropriate level.

For example, the advanced CMOS transistor needs $V_{th}$ adjusted to ±0.1 V or around, so that it is necessary to use a material having an effective work function (EWF) equivalent to the work function of N-type polysilicon (4.0 eV) for the N-type MOSFET, and to use a material having an EWF equivalent to the work function of N-type polysilicon (5.2 eV) for the P-type MOSFET.

At present, titanium nitride (TiN) has widely been investigated as a candidate material for the metal gate electrode, appreciating is thermal stability and readiness of patterning into gate electrode geometry. TiN placed on a high-k gate insulating film is, however, known to show an EWF at around the middle of the band gap of Si, and is therefore incapable of achieving low $V_{th}$ by this technique alone.

Kunihiko Iwamoto et al. describe a technique in Applied Physics Letters 92, 132907, 2008 "Experimental evidence for the flatband voltage shift of high-k metal-oxide-semiconductor devices due to the dipole formation at the high-k/SiO$_2$ interface", that EWF may be increased and thereby $V_{th}$ may be lowered through shifting of the flatband voltage ($V_{FB}$) towards the positive bias side, by inserting an aluminum oxide film (capping film) between the TiN electrode and the high-k gate insulating film.

On the other hand, Japanese Laid-Open Patent Publication No. 2009-239080 describes a technique of controlling height of Schottky barrier formed at the interface between a semiconductor substrate and a metal layer formed on the semiconductor substrate, by forming in between an oxide film mainly composed of Hf or Zr.

SUMMARY

Iwamoto et al. describes that the $V_{th}$ of the P-type MOSFET may be lowered by inserting the capping film (aluminum oxide film) at the interface between the gate electrode and the gate insulating film.

In order to independently adjust the $V_{th}$ for each of an NMOS region and a PMOS region on a single substrate based on this technical idea, it is necessary to selectively insert a lanthanum oxide film (capping film) in the NMOS region, and to insert an aluminum oxide film (capping film) in the PMOS region.

In short, it will be necessary to use at least two species of work function adjusting element for both regions. The thus-configured CMOS needs complicated processes for the manufacturing, and thereby the productivity may degrade.

In addition, although the P-type MOSFET described by Iwamoto et al. might successfully be increased in the effective work function, by inserting the oxide film containing Al as the work function adjusting element generally used for PMOS, between the TiN electrode and the high-k gate insulating film, the degree of increase still remains a room for improvement.

Again, the technique described by Japanese Laid-Open Patent Publication No. 2009-239080 might be effective in terms of controlling the Schottky barrier height formed between the semiconductor substrate and the metal layer, but a mechanism of determination is totally different between the Schottky barrier height and the effective work function of the gate electrode formed over the high-k gate insulating film. In short, it is difficult to apply the technique of controlling the Schottky barrier height directly as the technique of controlling the effective work function.

The present inventors found out from our investigations that the $V_{th}$ may separately be adjustable for the NMOS region and the PMOS region, by using the same species of work function adjusting element, and appropriately controlling the order of stacking of a film containing the work function adjusting element.

The present inventors finally reached the configurations below.

According to the present invention, there is provided a semiconductor device which includes:
a substrate; and
an N-channel MIS transistor and a P-channel MIS transistor provided on the same substrate.

Each of the N-channel MIS transistor and the P-channel MIS transistor has a Hf-containing, high-k gate insulating film, and a gate electrode provided over the high-k gate insulating film.

The N-channel MIS transistor has a silicon oxide film or a silicon oxynitride film, which contains a first work function adjusting element, provided between the substrate and the high-k gate insulating film, and, the P-channel MIS transistor has a silicon oxide film or a silicon oxynitride film, which contains the first work function adjusting element same as that contained in the N-channel MIS transistor, provided between the high-k gate insulating film and the gate electrode.

According to the present invention, there is also provided a semiconductor device which includes:
a substrate; and
a N-channel MIS transistor and a P-channel MIS transistor provided over the same substrate.

Each of the N-channel MIS transistor and the P-channel MIS transistor has a Hf-containing, high-k gate insulating film, and a gate electrode provided over the high-k gate insulating film.

The P-channel MIS transistor has a silicon oxide film or a silicon oxynitride film, which contains a second work function adjusting element, provided between the substrate and the high-k gate insulating film, and, the N-channel MIS transistor has a silicon oxide film or a silicon oxynitride film, which contains the second work function adjusting element same as that contained in the P-channel MIS transistor, provided between the high-k gate insulating film and the gate electrode.

According to the present invention, there is still also provided a method of manufacturing a semiconductor device. The method includes:

a step of forming, in an N-channel region of a substrate having the N-channel region and a P-channel region formed therein, a silicon oxide film or a silicon oxynitride film which contains a first work function adjusting element, a Hf-containing, high-k gate insulating film, and a gate electrode; as well as forming, in the P-channel region of the substrate, a Hf-containing, high-k gate insulating film, a silicon oxide film or a silicon oxynitride film which contains the first work function adjusting element same as that used in the N-channel region, and a gate electrode.

According to the present invention, there is also provided a method of manufacturing a semiconductor device. The method includes:

a step of forming, in a P-channel region of a substrate having an N-channel region and the P-channel region formed therein, a silicon oxide film or a silicon oxynitride film which contains a second work function adjusting element, a Hf-containing, high-k gate insulating film, and a gate electrode; as well as forming, in the N-channel region of the substrate, a Hf-containing, high-k gate insulating film, a silicon oxide film or a silicon oxynitride film which contains the second work function adjusting element same as that used in the P-channel region, and a gate electrode.

In these configurations described in the above, the same species of work function adjusting element is used for both of the N-channel region and the P-channel region. In other words, the first work function adjusting element, which is generally used for N-channel MIS transistor, is used for the P-channel region, and the second work function adjusting element, which is generally used for the P-channel MIS transistor, is used for the N-channel region. Manufacturing processes are therefore simplified as compared with the case where different work function adjusting elements are used for the N-channel region and the P-channel region, and thereby the productivity will be improved.

The present inventor founds out from our further investigations that, by forming a silicon oxide film or a silicon oxynitride film, which contains a work function adjusting element generally used for N-channel MIS transistor, between the high-k gate insulating film and the gate electrode in the P-channel MIS transistor, the effective work function may be increased, and thereby P-channel MIS transistor having low $V_{th}$ may be obtained, as compared with the case where the conventional work function adjusting element for PMOS, such as Al, was used.

According to the present invention, there is also provided a semiconductor device which includes:

a substrate; and a P-channel MIS transistor provided over the substrate.

The P-channel MIS transistor has a Hf-containing, high-k gate insulating film, and a gate electrode provided over the high-k gate insulating film.

The P-channel MIS transistor has a silicon oxide film or a silicon oxynitride film, which contains a first work function adjusting element which includes at least one element selected from the group consisting of La, Y and Mg, provided between the high-k gate insulating film and the gate electrode.

According to the present invention, a semiconductor device and a method of manufacturing the same, excellent in the productivity, may be provided.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1:
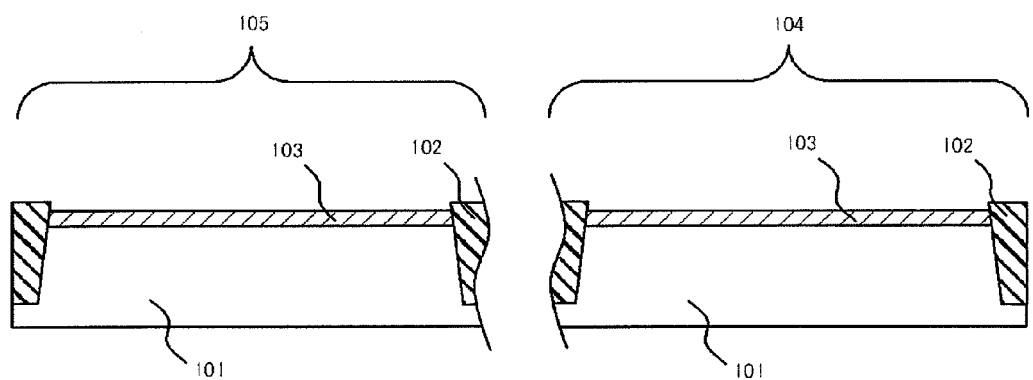
FIGS. 1 to 7 are sectional views sequentially illustrating procedures of manufacturing of a semiconductor device according to a first embodiment of the present invention.

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Embodiments of the present invention will be explained below, referring to the attached drawings. Note that all similar constituents in all drawings will be given similar reference numerals or symbols, so as to appropriately avoid repetitive explanation.

First Embodiment

First, the semiconductor device of the first embodiment will be explained.

Figure 8:
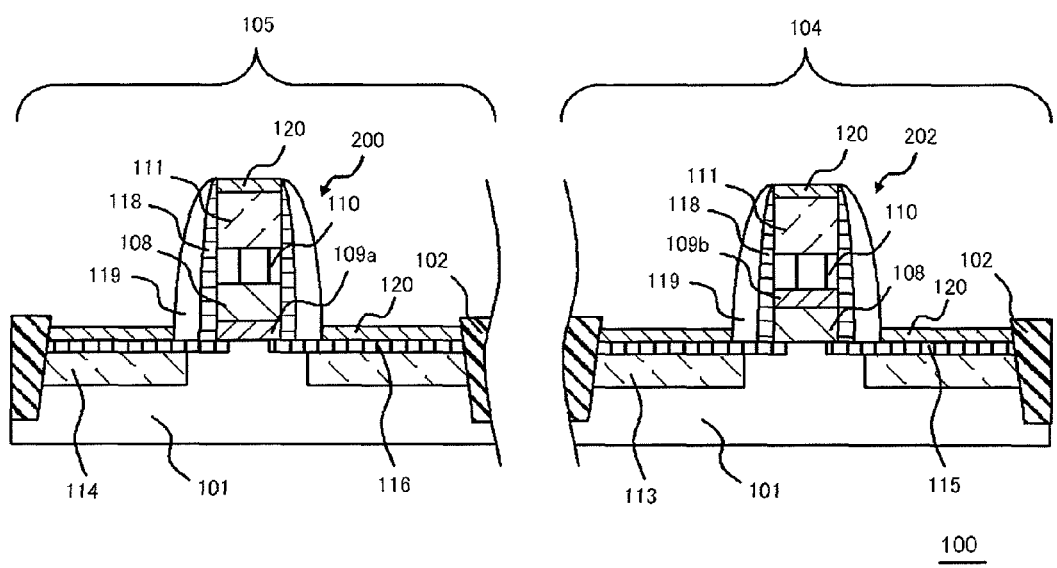
FIG. 8 is a sectional view illustrating the semiconductor device of the first embodiment.

FIG. 8 is a sectional view illustrating the semiconductor device of the first embodiment, taken along the length of channel of MOSFET.

A semiconductor device 100 of this embodiment has a substrate (silicon substrate 101), and an N-channel MIS transistor (N-type transistor 200) and a P-channel MIS transistor (P-type transistor 202) provided over the same silicon substrate 101. Each of the N-type transistor 200 and the P-type transistor 202 similarly has a Hf-containing, high-k gate insulating film 108, and a gate electrode (TiN film 110) provided over the high-k gate insulating film 108. The N-type transistor 200 has a silicon oxide film (La-added $SiO_2$ film 109a) or a silicon oxynitride film, which contains a first work function adjusting element, provided between the silicon substrate 101 and the high-k gate insulating film 108. On the other hand, the P-type transistor 202 has a silicon oxide film (La-added $SiO_2$ film 109b) or a silicon oxynitride film, which contains the first work function adjusting element same as that used for the N-type transistor 200, provided between the high-k gate insulating film 108 and the gate electrode (TiN film 110). More specifically, in the semiconductor device 100 of this embodiment, P-type transistor 202 has a silicon oxide film (La-added $SiO_2$ film 109b) or a silicon oxynitride film, which contains a first work function adjusting element including at least one element selected from the group consisting of La, Y and Mg, provided between the high-k gate insulating film 108 and the gate electrode (TiN film 110). In this embodiment, the same single species of first work function adjusting element is used for both of the P-channel region 104 and the N-channel region 105.

The semiconductor device 100 has the silicon substrate 101; device isolation region 102 formed in the surficial portion of the silicon substrate 101; the P-type channel region 104 and the N-type channel region 105 isolated by the device isolation region 102; and the P-type transistor 202 (MISFET) and the N-type transistor 200 (MISFET) respectively formed in the P-type channel region 104 and the N-type channel region 105 of the silicon substrate 101.

The P-type transistor 202 has the Hf-containing, high-k gate insulating film 108 formed over the silicon substrate 101; the La-added $SiO_2$ film 109b formed over the high-k gate insulating film 108; and the TiN film 110 as a metal gate electrode formed over the La-added $SiO_2$ film 109b. The P-type transistor 202 additionally has a Si film 111 formed over the TiN film 110; a silicide film 120 formed over the Si film 111; offset spacers 118 and sidewall spacers 119 formed on the side faces of the gate electrode; a P-type source/drain diffusion layer 113 and a P-type extension diffusion layer 115 formed in the surficial portion of the silicon substrate 101; and a silicide film 120 formed over the surface of the P-type extension diffusion layer 115.

The N-type transistor 200 has the La-added $SiO_2$ film 109a formed over the silicon substrate 101; the high-k gate insulating film 108 formed over the La-added $SiO_2$ film 109a; and a TiN film 110 as a metal gate electrode formed over the high-k gate insulating film 108. The N-type transistor 200 additionally has the Si film 111 formed over the TiN film 110; the silicide film 120 formed over the Si film 111; the offset spacers 118 and the sidewall spacers 119 respectively formed on the side faces of the gate electrode; an N-type source/drain diffusion layer 114 and an N-type extension diffusion layer 116 formed in the surficial portion of the silicon substrate 101; and the silicide film 120 formed over the surface of the N-type extension diffusion layer 116.

In this embodiment, the high-k gate insulating film 108 may be configured by HfSiON or HfON. The offset spacers 118 and the sidewall spacers 119 are configured by a silicon oxide film and a silicon nitride film, respectively.

Between the silicon substrate 101 and the high-k gate insulating film 108 of the N-type transistor 200, the silicon oxide film or the silicon oxynitride film (La-added $SiO_2$ film 109b), which contains a work function adjusting element, is provided. The work function adjusting element may be any one of La, Y and Mg. These work function adjusting elements may generally lower the effective work function of the N-type transistor 200. La is used in this embodiment.

On the other hand, between the high-k gate insulating film 108 and the TiN film 110 of the P-type transistor 202, provided is the silicon oxide film or the silicon oxynitride film (La-added $SiO_2$ film 109b), which contains the work function adjusting element same as that used for the N-type transistor 200. In this embodiment, the work function adjusting element may be any one of La, Y and Mg. La is used in this embodiment.

The present inventors now found out from our investigations that range of modulation of the effective work function of the P-type transistor 202 may more largely be increased by using the work function adjusting element generally used for the N-type transistor 200, as compared with the case where Al, which is generally used for P-type transistor 202, is used, if position or existing state of the work function adjusting element is appropriately selected. In other words, by introducing the work function adjusting element, which is generally used for the N-type transistor 200, into the interface between the high-k gate insulating film 108 and the TiN film 110 of the P-type transistor 202, and by introducing it in the form of free element into the silicon oxide film or into the silicon oxynitride film, the range of modulation of the effective work function of the P-type transistor 202 in this embodiment may more largely be increased, as compared with the amount of increase conventionally attained by Al.

Next, the method of manufacturing according to the first embodiment of the present invention will be explained.

FIGS. 1 to 7 are sectional views for explaining the method of manufacturing a semiconductor device of this embodiment, taken along the length of channel of MOSFET.

The method of manufacturing a semiconductor device of this embodiment includes a step of forming, in the N-channel region 105 of the substrate (silicon substrate 101) having the N-channel region 105 and the P-channel region 104 formed therein, the silicon oxide film or the silicon oxynitride film which contains the first work function adjusting element (La-added $SiO_2$ film 109a), the Hf-containing, high-k gate insulating film 108, and the gate electrode (TiN film 110); as well as forming, in the P-channel region 104 of the substrate, the Hf-containing, high-k gate insulating film 108, and the silicon oxide film or the silicon oxynitride film (La-added $SiO_2$ film 109b) which contains the first work function adjusting element same as that used in the N-channel region, and the gate electrode (TiN film 110). More specifically, first, in the N-channel region 105 of the substrate (silicon substrate 101) having the N-channel region 105 and the P-channel region 104 formed therein, the silicon oxide film or the silicon oxynitride film which contains the first work function adjusting element (La-added $SiO_2$ film 109a) is formed. Next, the Hf-containing, high-k gate insulating film 108 is formed in the N-channel region 105 and in the P-channel region 104. Next, the silicon oxide film or the silicon oxynitride film, which contains the first work function adjusting element same as that contained in the N-channel region 105, is formed over the high-k gate insulating film 108 in the P-channel region 104. Next, the gate electrodes (TiN film 110) are formed respectively in the N-channel region 105 and the P-channel region 104. The method of manufacturing a semiconductor device also includes a step of forming, over the high-k gate insulating film 108 in the P-channel region 104, the silicon oxide film or the silicon oxynitride film which contains the work function adjusting element containing at least one element selected from the group consisting of La, Y and Mg.

For more details, first, as illustrated in FIG. 1, the device isolation region 102 having STI (Shallow Trench Isolation) structure is formed over the silicon substrate 101 by a publicly-known method. Next, a sacrificial oxide film 103 is grown over the surface of the silicon substrate 101, in a device-forming region formed between the device isolation region 102.

Next, boron is implanted in the N-channel region 105, and phosphorus or arsenic is implanted in the P-channel region 104. By the ion implantation, ions are introduced through the sacrificial oxide film 103 into the surficial portions of the silicon substrate 101. Next, the sacrificial oxide film 103 is removed, typically by using aqueous $NH_4F$ solution or dilute hydrofluoric acid.

Figure 2:
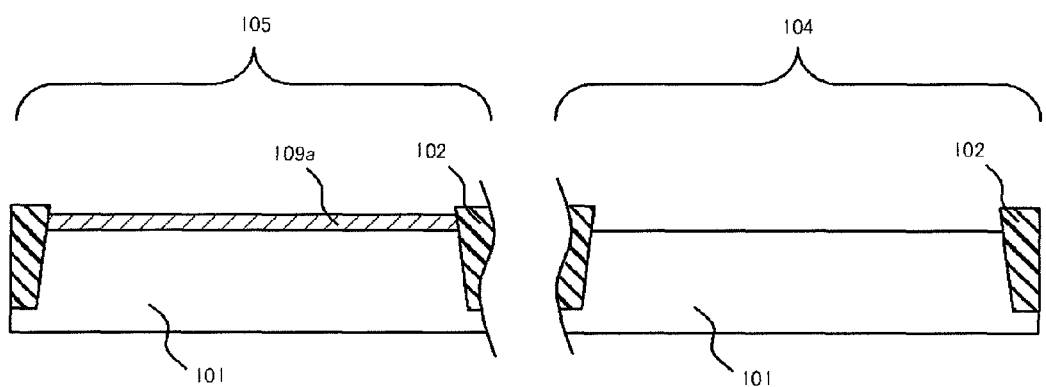

Next, as illustrated in FIG. 2, a silicon oxide film (chemical $SiO_2$ film) or a silicon oxynitride film (SiON film) is selectively formed in the N-channel region 105. In this embodiment, a silicon oxide film is used. The silicon oxide film may also be formed by thermal oxidation. Next, over the silicon oxide film, a metal film which contains a work function adjusting element for NMOS is formed by CVD (Chemical Vapor Deposition) or PVD (Physical Vapor Deposition). In this embodiment, a $La_2O_3$ (lanthanum oxide) film is used as the metal film. Next, the metal film is annealed. The work function adjusting element diffuses into the silicon oxide film, and thereby the La-added $SiO_2$ film 109a is formed over the silicon substrate 101 in the N-channel region 105. An excessive portion of the $La_2O_3$ film is then removed.

In this embodiment, a silicon oxynitride film may be adoptable in place of the silicon oxide film. The silicon oxynitride film may be formed, typically by forming a chemical $SiO_2$ film, nitriding the chemical $SiO_2$ film (typically by plasma-assisted nitriding), and oxidizing the thus-nitrided chemical $SiO_2$ film (typically by oxygen annealing). In this way, the La-added silicon oxynitride film may be formed over silicon substrate 101 in the N-channel region 105.

Figure 3:
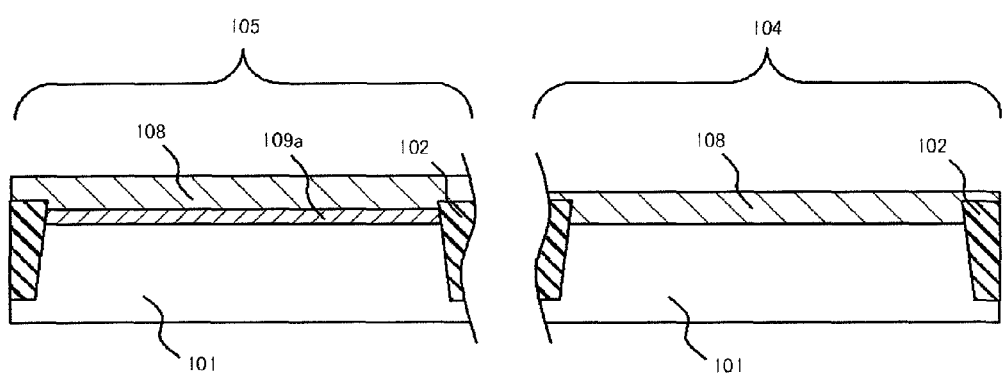

Next, an unillustrated HfSiO film (hafnium silicon oxide film) is formed over the entire surface of the silicon substrate 101 by MOCVD (Metal Organic Chemical Vapor Deposition). The HfSiO film is then subjected to plasma treatment in a nitrogen atmosphere, followed by annealing. In this way, as illustrated in FIG. 3, the HfSiO film is modified into a HfSiON film 108 (hafnium silicon oxinitride film), to thereby configure the high-k gate insulating film 108.

Alternatively, the high-k gate insulating film 108 in the P-channel region 104 may be added with nitrogen typically by nitrogen plasma irradiation or nitrogen ion implantation, after forming an unillustrated resist mask over the high-k gate insulating film 108 in the N-channel region 105. In this way, nitrogen concentration of the high-k gate insulating film 108 in the P-channel region 104 may be set higher than that in the N-channel region 105. The resist mask is then removed. In this embodiment, the concentration may be expressed by atomic concentration.

Figure 4:
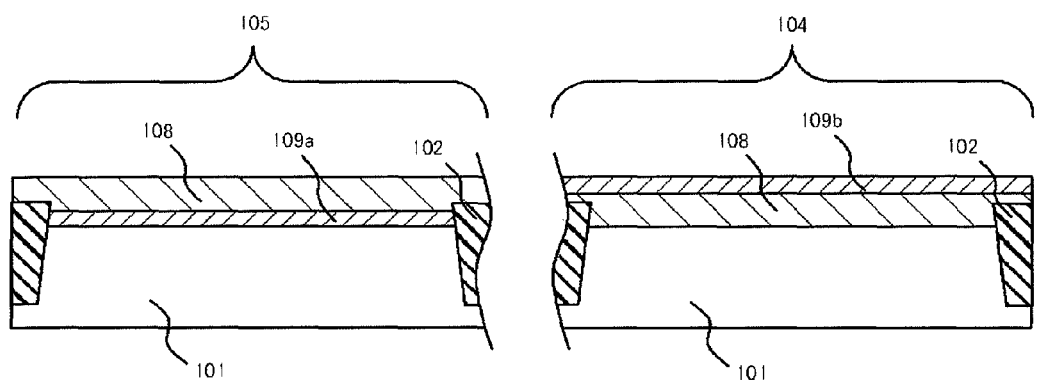

Next, as illustrated in FIG. 4, the silicon oxide film or the silicon oxynitride film is formed, selectively over the high-k gate insulating film 108 in the P-channel region 104. In this embodiment, a silicon oxide film is adopted. A metal film which contains a work function adjusting element for NMOS is then formed over the silicon oxide film, by CVD or PVD. In this embodiment, a $La_2O_3$ (lanthanum oxide) film is used as the metal film. The metal film is then annealed, so as to diffuse the work function adjusting element into the silicon oxide film. In this way, the La-added $SiO_2$ film 109b is formed over the high-k gate insulating film 108 in the P-channel region 104. Thereafter, an excessive portion of the $La_2O_3$ layer is removed. Thickness of the La-added $SiO_2$ film 109b in this process may be adjusted to 1 nm, for example, while not specifically limited. Alternatively, similarly to the process on the N-channel region 105 side, the La-added SiON film may be formed over the high-k gate insulating film 108 in the P-channel region 104, by using a silicon oxynitride film in place of the silicon oxide film.

Figure 5:
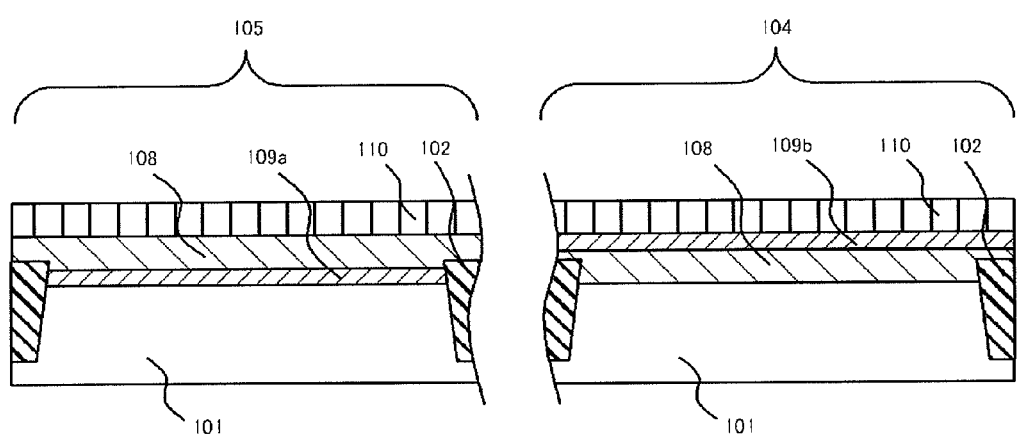

Next, as illustrated in FIG. 5, the TiN film 110 is formed respectively over the high-k gate insulating film 108 in the N-channel region 105 and over the La-added $SiO_2$ film 109b in the P-channel region 104. The TiN film 110 may be formed typically by sputtering using a TiN target, reactive sputtering by which the TiN film is formed by sputtering a Ti target in a nitrogen atmosphere, CVD, or ALD (Atomic Layer Deposition).

Figure 6:
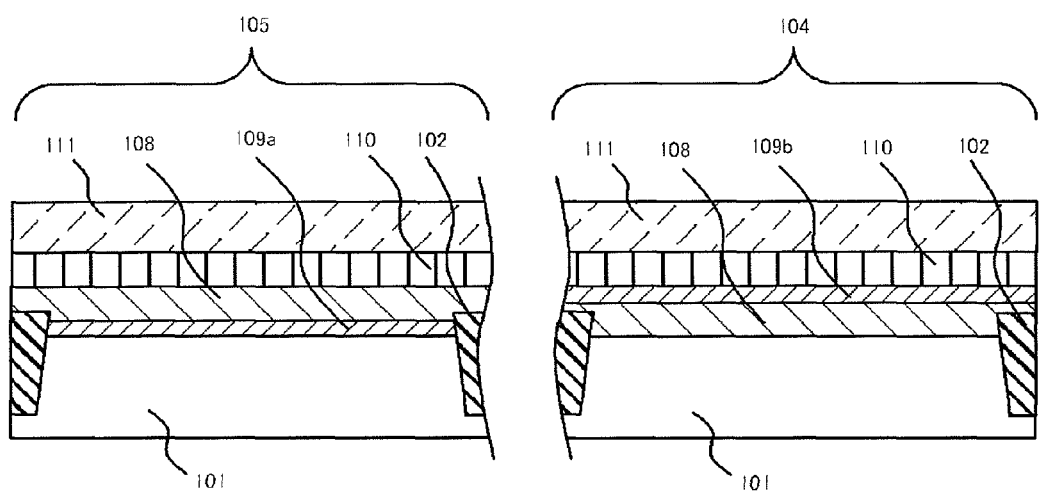
Figure 7:
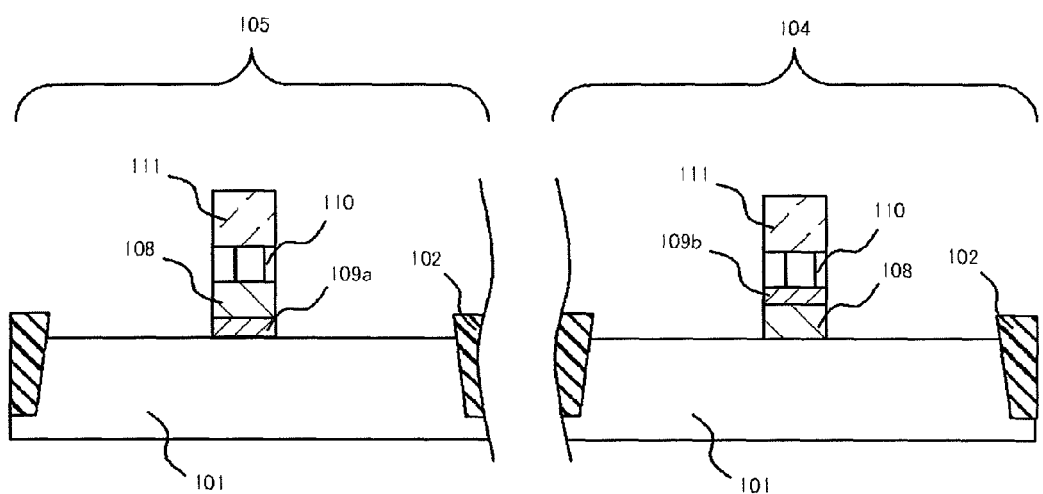

Next, as illustrated in FIG. 6, the Si film 111 is formed over the entire surface of the TiN film 110. Then as illustrated in FIG. 7, the Si film 111 and the TiN film 110 are patterned by RIE (Reactive Ion Etching), using an unillustrated hard mask. The underlying La-added $SiO_2$ film 109a, the La-added $SiO_2$ film 109b, and the high-k gate insulating film 108 are further etched to give a gate geometry.

Next, an insulating film is formed over the entire surface of the obtained article typically by CVD, and the insulating film is then anisotropically etched by RIE, so as to form the offset spacers (not illustrated). The offset spacers may be configured by a silicon oxide film or a silicon oxynitride film, for example. Another insulating film is deposited over the entire surface of the obtained article typically by CVD, and the insulating film is then anisotropically etched by RIE, so as to form the sidewall spacers (not illustrated). The sidewall spacers may be configured by a silicon oxynitride film or a silicon oxide film.

Next, B (boron) is introduced into the P-channel region 104 by ion implantation using a resist mask (not illustrated) which covers the N-channel region 105, so as to form the P-type source/drain diffusion layer 113. The resist mask is then removed. Similarly, P or As is introduced into the N-channel region 105 by ion implantation using a resist mask (not illustrated) which covers the P-channel region 104, so as to form the N-type source/drain diffusion layer 114. The resist mask is then removed. The obtained article is then annealed.

Next, the unillustrated sidewall spacers are removed, and B is then introduced into the P-channel region 104 by ion implantation using a resist mask (not illustrated) so as to form the P-type extension diffusion layer 115. The resist mask is then removed. Similarly, P or As is introduced into the N-channel region 105 by ion implantation using a resist mask (not illustrated) so as to form the N-type extension diffusion layer 116. The resist mask is then removed. The obtained article is then annealed.

Note that annealing for forming the silicon oxide film or the silicon oxynitride film which contains the first work function adjusting element, such as La-added $SiO_2$ film 109b, is not specifically limited, and may be any of the annealing processes carried out after the lanthanum oxide film (a metal film containing the first work function adjusting element) is formed. Alternatively, an additional annealing process optimized for forming the La-added $SiO_2$ film 109b may be carried out.

The double-layered sidewall spacers, composed of the offset spacers 118 ($SiO_2$ film) and the sidewall spacers 119 (silicon oxynitride film) are then formed by CVD and RIE. A silicide film 120 is then formed respectively in the surficial portions of the P-type extension diffusion layer 115, the N-type extension diffusion layer 116 and the Si film 111 in a self-aligned manner, by a publicly-known SALICIDE process. In this way, the semiconductor device 100 of this embodiment, illustrated in FIG. 8, may be obtained. As a consequence, as illustrated in FIG. 8, the gate electrodes respectively having a silicide/Si/metal gate stacked structure may be formed in the N-type transistor 200 and in the P-type transistor 202.

The above-described process is followed by formation of an insulating interlayer, formation and filling of contact holes, formation of interconnects and so forth, similarly to those adopted to conventional transistor processes, thereby the semiconductor integrated circuit having CMOS FET may be formed.

Next, operations and effects of the first embodiment will be explained.

In this embodiment, the La-added $SiO_2$ film 109b is formed between the HfSiON film (high-k gate insulating film 108) and the TiN electrode (TiN film 110) of the P-type transistor 202. La used herein is a work function adjusting element same as that used for the N-type transistor 200. This induces an interfacial dipole, which contributes to increase the effective work function of the TiN electrode, at the interface between the TiN electrode and the HfSiON film of the P-type transistor 202. The range of modulation of the effective work function (approximately 0.6 eV) by La is larger than the conventionally expectable amount of increase of the effective work function (approximately 0.2 eV) by Al having been used as the work function adjusting element for PMOS. Accordingly, this embodiment may successfully obtain the P-type transistor 202 having lower $V_{th}$ as compared with that obtainable by the conventional techniques.

In this embodiment, position of placement of the silicon oxide film or the silicon oxynitride film, which contains the work function adjusting element such as La, is varied between the P-type transistor 202 and the N-type transistor 200, so that the effective work function of the N-type transistor 200 may be lowered while increasing the effective work unction of the P-type transistor 202, despite only a single species of work function adjusting element is used. More specifically, the La-added $SiO_2$ film is inserted at the interface between the TiN film 110 (gate electrode) and the high-k gate insulating film 108 in the P-type transistor 202, whereas it is inserted at the interface between the high-k gate insulating film 108 and the substrate (silicon substrate 101) in the N-type transistor 200, so as to independently adjust $V_{th}$ for the NMOS and PMOS regions. As a consequence, this embodiment successfully adjusts $V_{th}$ for both of P-type transistor 202 and the N-type transistor 200, only by using a single species of work function adjusting element but varying the position of placement thereof, and thereby simplifies the manufacturing processes and saves the cost.

In addition, the high-k gate insulating film 108 of the P-channel region 104 in this embodiment typically contains nitrogen, capable of suppressing the work function adjusting element such as La from diffusing. By virtue of the high-k gate insulating film 108, La contained in the La-added $SiO_2$ film 109b formed thereabove may be prevented from diffusing towards the interface between the high-k gate insulating film 108 and the semiconductor substrate (silicon substrate 101), even after being allowed to pass through the annealing. Accordingly, the electric dipole, which is causative of reducing the effective work function of the TiN electrode (TiN film 110), is suppressed from being induced at the interface between the high-k gate insulating film 108 and the semiconductor substrate (silicon substrate 101), and thereby the P-type transistor 202 having a low $V_{th}$ may be obtained.

The work function adjusting element for the P-type transistor 202 is not limited to La. Effects similar to that of La are also obtainable by either one of, or combination of Y and Mg.

Another known technique for lowering the $V_{th}$ is such as selectively introducing a lanthanum oxide film (capping film) at the interface between the TiN electrode and the high-k gate insulating film of the N-type MOSFET, so as to shift the flatband voltage ($V_{FB}$) towards the negative bias side, to thereby lower the EWF, and to consequently lower the $V_{th}$. It has also been known that the amount of shifting of the $V_{FB}$ towards the negative bias side increases as the thickness of the lanthanum oxide film increases, and that a desired level of the $V_{th}$ may be obtained by lowering the EWF down to as low as the end of conduction band of Si.

In contrast, in the P-type transistor 202 of this embodiment, the La-added $SiO_2$ film 109b, having the work function adjusting element same as that used for the N-type transistor 200 diffused therein, is formed between the HfSiON film (high-k gate insulating film 108) and the TiN film 110. Accordingly, the interfacial dipole which contributes to increase effective work function of the TiN electrode may be induced at the interface between the TiN electrode and the HfSiON of the P-type transistor 202. As a consequence, the P-type transistor 202 having lower $V_{th}$ as compared with that obtainable by the conventional techniques may be obtained.

Second Embodiment

Next, the semiconductor device of the second embodiment will be explained.

Figure 17:
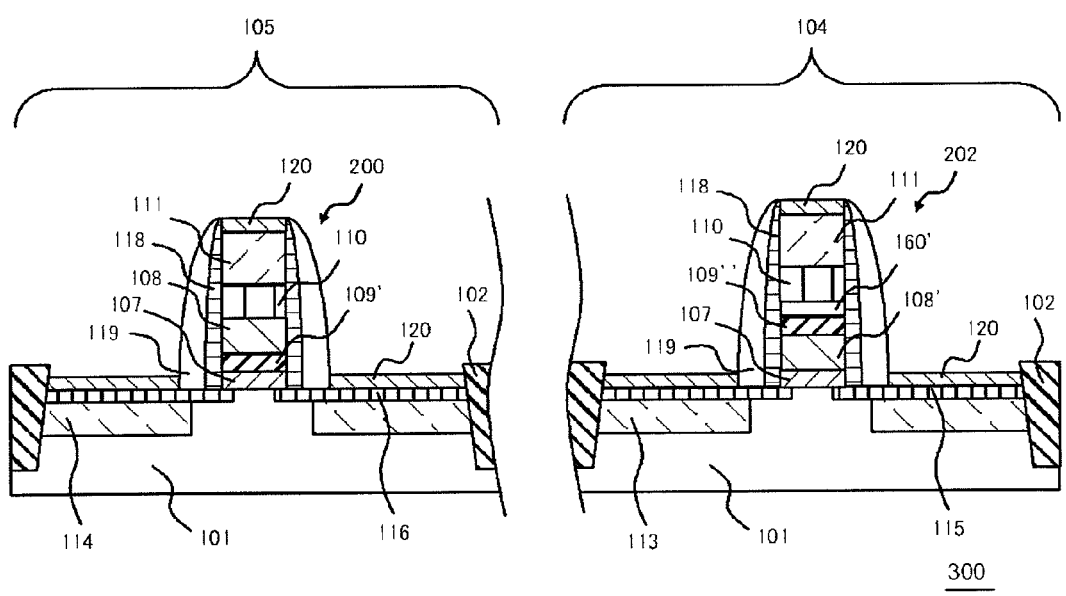
FIG. 17 is a sectional view illustrating the semiconductor device of the second embodiment.

FIG. 17 is a sectional view illustrating the semiconductor device of the second embodiment, taken along the length of channel of MOSFET.

A semiconductor device 300 of the second embodiment has the P-type transistor 202 and the N-type transistor 200. The P-type transistor 202 has a chemical oxide film 107 formed over the silicon substrate 101, a high-k gate insulating film 108' formed over the chemical oxide film 107, and the TiN film 110 and the silicide film 120 respectively formed over the high-k gate insulating film 108'. A La-added $SiO_2$ film 109" and a $SiO_2$ film 160' are formed between the high-k gate insulating film 108' and the TiN film 110.

On the other hand, the N-type transistor 200 has a chemical oxide film 107 formed over the silicon substrate 101, a high-k gate insulating film 108 formed over the chemical oxide film 107, and the TiN film 110 and the silicide film 120 respectively formed over the high-k gate insulating film 108. A La-added $SiO_2$ film 109' is formed between the chemical oxide film 107 on the silicon substrate 101, and the high-k gate insulating film 108.

Next, a method of manufacturing a semiconductor device according to the second embodiment will be explained.

FIGS. 9 to 16 are sectional views for explaining the method of manufacturing a semiconductor device according to the second embodiment.

The method of manufacturing the semiconductor device 300 of the second embodiment is similar to the method of the first embodiment, except for that the process for diffusing the work function adjusting element is simultaneously carried out both for the P-channel region 104 and the N-channel region 105. More specifically, the method of manufacturing the semiconductor device 300 of the second embodiment includes the steps below. First, the chemical oxide film 107 or the silicon oxynitride film is formed respectively in the N-channel region 105 and the P-channel region 104 of the substrate (silicon substrate 101). Next, the high-k gate insulating film 108 is formed in the N-channel region 105 and the P-channel region 104. Next, an element capable of suppressing the work function adjusting element from diffusing is introduced, selectively into the high-k gate insulating film 108 in the P-channel region 104, using a patterned resist mask 130. Next, a film (lanthanum oxide film 150) which contains a work function adjusting element is formed over the high-k gate insulating film 108 respectively in the N-channel region 105 and in the P-channel region 104, and a silicon oxide film ($SiO_2$ film 160) or a silicon oxynitride film is then formed over the lanthanum oxide film 150 in the P-channel region 104. Next, the obtained article is annealed. The gate electrodes (TiN film 110) are then formed respectively in the N-channel region 105 and the P-channel region 104. In the semiconductor device 300 thus obtained in this embodiment, the silicon oxide film (La-added $SiO_2$ film 109') or the silicon oxynitride film, which contains the work function adjusting element, is formed between the silicon substrate 101 and the high-k gate insulating film 108 in the N-channel region 105; and the silicon oxide film (La-added $SiO_2$ film 109") or the silicon oxynitride film, which contains a work function adjusting element, is formed between the high-k gate insulating film 108 and the TiN film 110 in the P-channel region 104.

Figure 9:
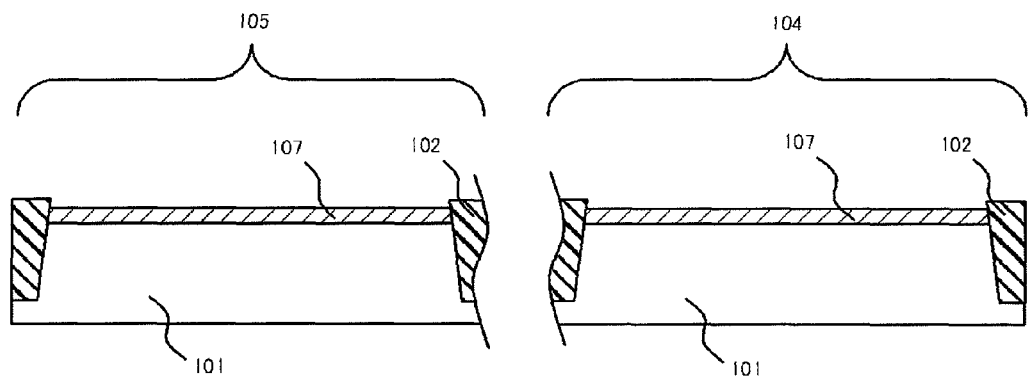
FIGS. 9 to 16 are sectional views sequentially illustrating procedures of manufacturing of a semiconductor device according to a second embodiment of the present invention.

For more details, first, as illustrated previously in FIG. 1, the P-channel region 104 and the N-channel region 105 are formed. Thereafter, as illustrated in FIG. 9, the chemical oxide film 107 (chemical $SiO_2$ film) is formed over the silicon substrate 101 respectively in the P-channel region 104 and the N-channel region 105. The chemical oxide film 107 may be formed by a method similar to that described in the above. Alternatively, a silicon oxynitride film may be used in place of the chemical oxide film 107.

Figure 10:
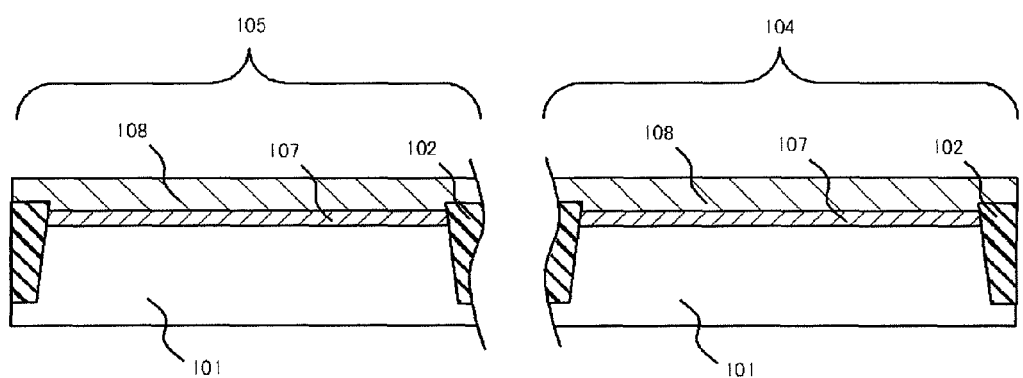

Next, an unillustrated HfSiO film (hafnium silicate film) is formed by MOCVD, over the entire surface of the chemical oxide film 107. The HfSiO film is subjected to plasma treatment in a nitrogen atmosphere, and then annealed. In this way, the HfSiO film is modified to configure the high-k gate insulating film 108 (HfSiON film) (FIG. 10).

Figure 11:
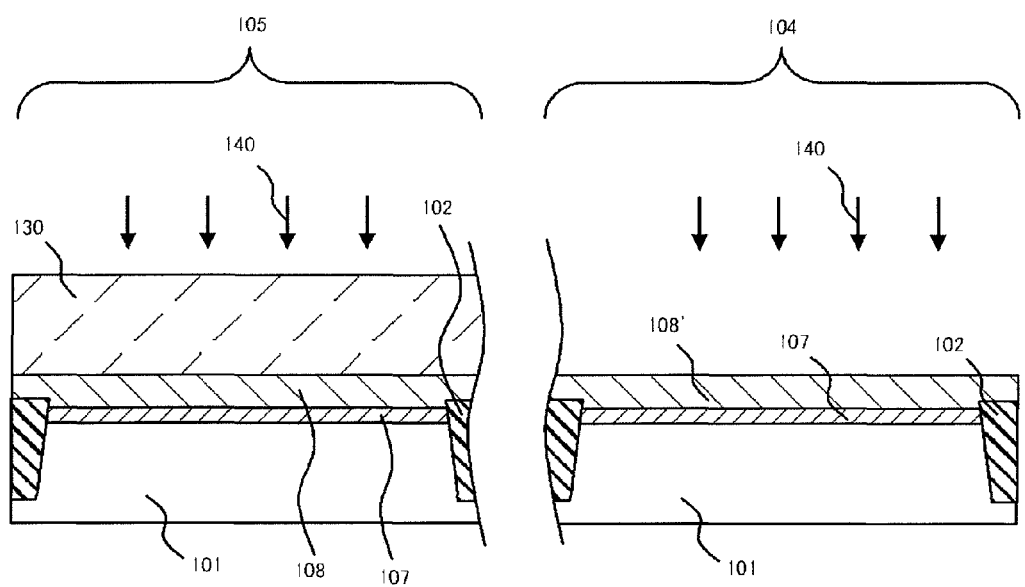

Next, as illustrated in FIG. 11, the resist mask 130 patterned so as to expose the P-channel region 104 is formed. Next, using the resist mask 130 thus formed so as to cover the N-channel region 105, nitrogen is introduced into the high-k gate insulating film 108 in the P-channel region 104, by irradiating nitrogen plasma 140 or nitrogen ion implantation, so as to modify the film into the nitrogen-added, high-k gate insulating film 108'. In this way, the high-k gate insulating film 108' in the P-channel region 104 has a nitrogen concentration larger than that of the high-k gate insulating film 108 in the N-channel region 105. The resist mask 130 is then removed.

Figure 12:
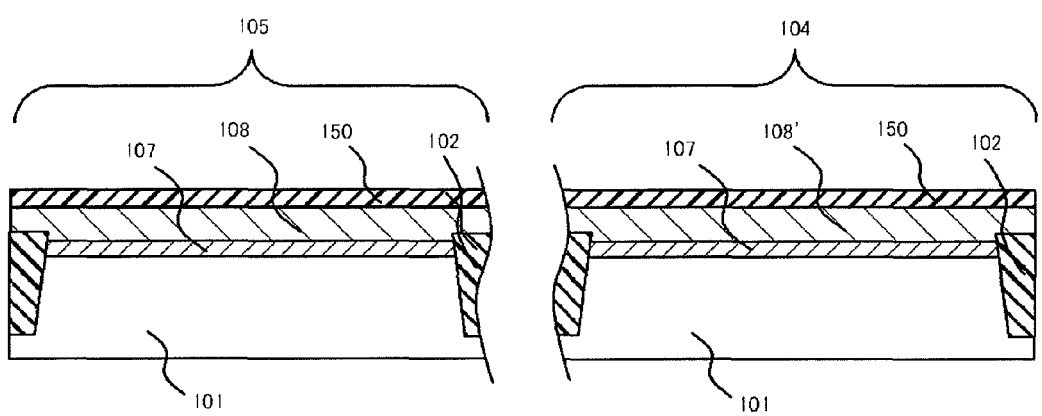

Next, as illustrated in FIG. 12, the lanthanum oxide film 150 (work function adjusting element-containing metal oxide film) is deposited respectively over the entire surface of the high-k gate insulating film 108 in the N-channel region 105, and over the high-k gate insulating film 108' in the P-channel region 104. In other words, the lanthanum oxide film 150 is formed both in the P-channel region 104 and the N-channel region 105 in a single process. The lanthanum oxide film 150 is typically formed by PVD. Thickness of the lanthanum oxide film 150 is typically adjusted to 1 nm or smaller.

Figure 13:
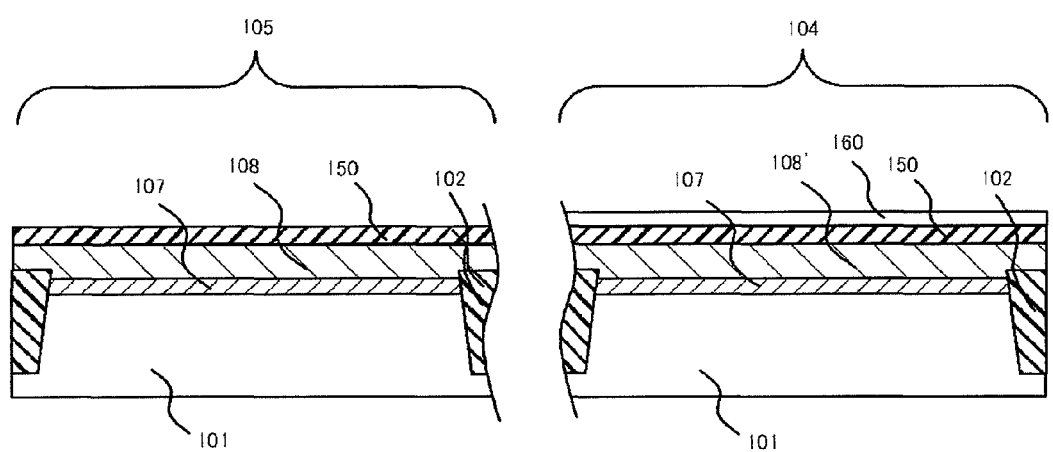

Next, as illustrated in FIG. 13, the $SiO_2$ film 160 is selectively formed only over the lanthanum oxide film 150 in the P-channel region 104. The $SiO_2$ film 160 is formed by PVD or CVD. Thickness of the $SiO_2$ film 160 is adjusted to 1 nm or smaller. Alternatively, a SiON film may be used in place of the $SiO_2$ film 160.

Figure 14:
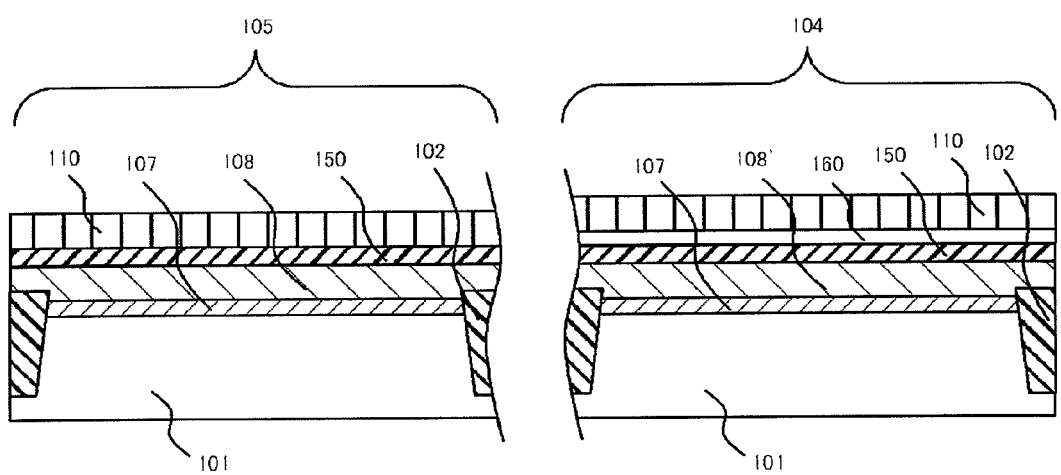

Next, as illustrated in FIG. 14, the TiN film 110 is formed respectively over the $SiO_2$ film 160 in the P-channel region 104, and over the lanthanum oxide film 150 in the N-channel region 105. The TiN film 110 is formed typically by sputtering using a TiN target, reactive sputtering by which the TiN film is formed by sputtering a Ti target in a nitrogen atmosphere, CVD, or ALD.

Figure 15:
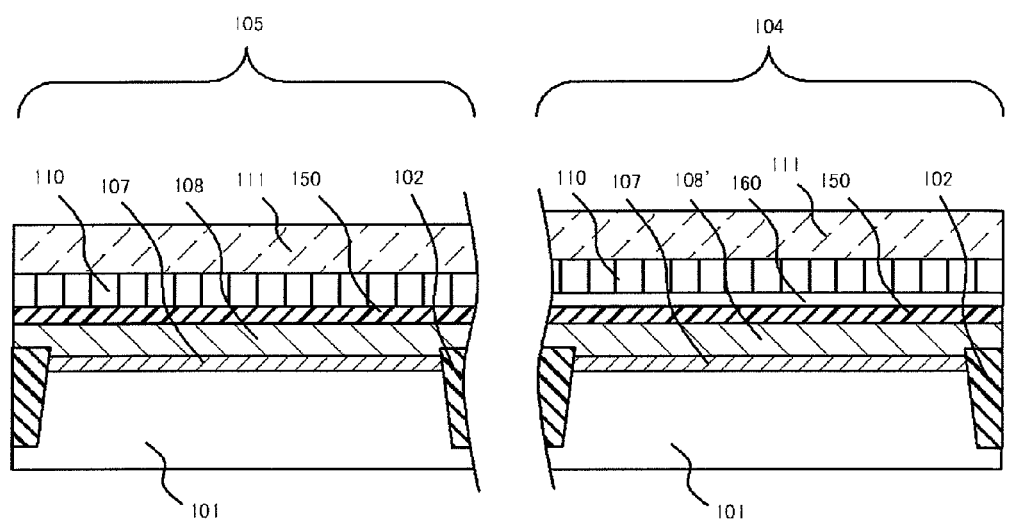
Figure 16:
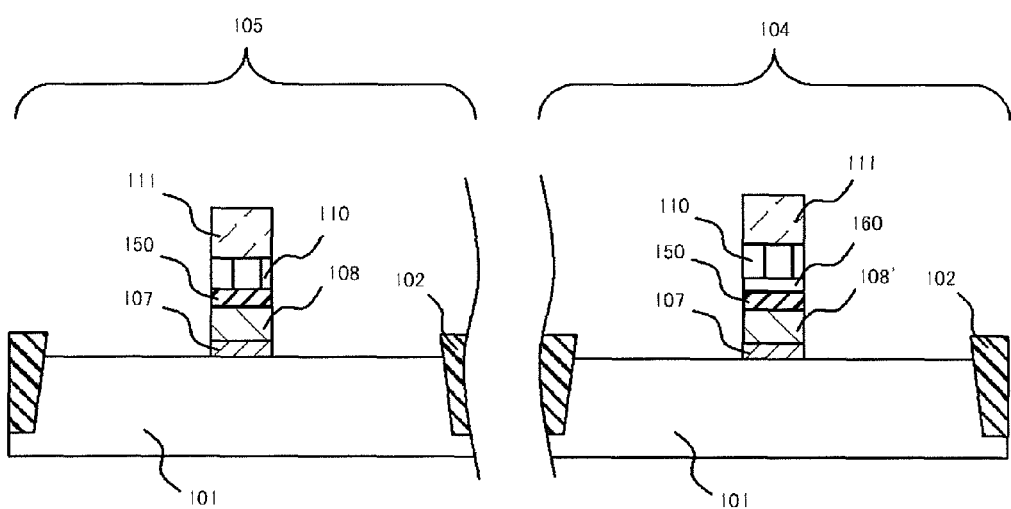

Next, as illustrated in FIG. 15, the Si film 111 is formed over the entire surface of the TiN film 110. Next, as illustrated in FIG. 16, the Si film 111 and the TiN film 110 are patterned by RIE, using an unillustrated hard mask. The underlying La-added lanthanum oxide film 150, the high-k gate insulating films 108, 108', the chemical oxide film 107, and the $SiO_2$ film 160 are further etched.

Thereafter, a CMOS FET as illustrated in FIG. 17 is obtained by processes similar to those described in the first embodiment.

Note that, in the process of annealing for forming the polysilicon (Si film 111) and extension diffusion layers 115, 116 in the method of manufacturing according to the second embodiment, La composing the lanthanum oxide film 150 in the N-channel region 105 diffuses towards the interface between the chemical oxide film 107 and the high-k gate insulating film 108. A final structure obtainable herein is such as having the La-added $SiO_2$ film 109' (or La-added SiON film) formed between the chemical oxide film 107 and the high-k gate insulating film 108.

On the other hand, in the P-channel region 104, La composing the lanthanum oxide film 150 in the P-channel region 104 reacts with a part (lower layer) of the $SiO_2$ film 160 (or SiON film) formed over the surface of the high-k gate insulating film 108', to thereby form the La-added $SiO_2$ film 109" (or La-added SiON film), by similar annealing. Since the high-k gate insulating film 108' has a high nitrogen concentration, La is suppressed from diffusing into the high-k gate insulating film 108'. Accordingly, La remains over the high-k gate insulating film 108', without diffusing into the high-k gate insulating film 108'. The residual portion (upper layer) of the $SiO_2$ film 160 (SiON film), left unreacted with the lanthanum oxide film 150, remains as the $SiO_2$ film 160' (or SiON film).

In the P-channel region 104 of the CMOS FET of the second embodiment, the La-added $SiO_2$ film 109" (La-added SiON film) resides only between the TiN electrode (TiN film 110) and the high-k gate insulating film 108', but does not resides between the high-k gate insulating film 108' and the silicon substrate 101. On the other hand, in the N-channel region 105, the La-added $SiO_2$ film 109' (or La-added SiON film) resides between the high-k gate insulating film 108 and the silicon substrate 101. By virtue of this configuration, electric dipole capable of reversely varying the effective work function of the TiN electrode in the P-channel and N-channel regions is induced, even if the same species of the work function adjusting element is used for both regions. As a consequence, in the second embodiment, $V_{th}$ may optimally be adjustable both for the P-channel region 104 and the N-channel region 105, by controlling the position of residence of a single species of work function adjusting element in the stacked structure of the gate.

In the second embodiment, a step of forming the metal film which contains a work function adjusting element (for example, lanthanum oxide film 150), and a step of diffusing La in the lanthanum oxide film 150 may commonly (equally) be carried out both for the P-channel region 104 and the N-channel region 105. Accordingly, the processes may be simplified and the cost may be saved. The second embodiment gives effects same as those in the first embodiment.

Note that annealing for forming the silicon oxide film or the silicon oxynitride film which contains the first work function adjusting element, such as La-added $SiO_2$ films 109', 109", is not specifically limited, and may be any of the annealing processes carried out after the lanthanum oxide film (a metal film containing the first work function adjusting element) is formed. Alternatively, an additional annealing process optimized for forming the La-added $SiO_2$ films 109', 109" may be carried out.

Third Embodiment

Figure 25:
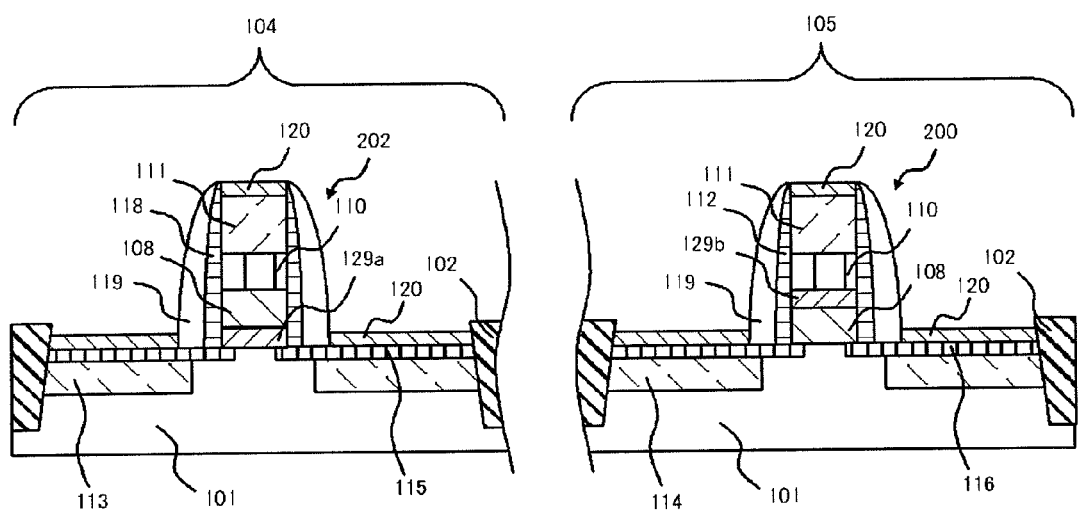
FIG. 25 is a sectional view illustrating the semiconductor device of the third embodiment.

FIG. 25 is a sectional view illustrating the semiconductor device of the third embodiment, taken along the length of channel of MOSFET.

The third embodiment is same as the first embodiment, except that a second work function adjusting element, generally used for P-type transistor such as Al, is used, and that the position of stacking of a metal film containing the second work function adjusting element is appropriately modified.

A semiconductor device 400 of the third embodiment will be explained. Note that all aspects similar to those in the first embodiment will not repetitively be described.

The semiconductor device 400 of this embodiment has the substrate (silicon substrate 101), and the N-channel MIS transistor (N-type transistor 200) and the P-channel MIS transistor (P-type transistor 202) formed on the same silicon substrate 101. The N-type transistor 200 and the P-type transistor 202 commonly have the Hf-containing, high-k gate insulating film 108 and the gate electrode (TiN film 110) formed over the high-k gate insulating film 108. The P-type transistor 202 has the silicon oxide film (Al-added $SiO_2$ film 129a) or the silicon oxynitride film, which contains the second work function adjusting element, formed between the silicon substrate 101 and the high-k gate insulating film 108. On the other hand, the N-type transistor 200 has the silicon oxide film (Al-added $SiO_2$ film 129b) or the silicon oxynitride film, which contains the second work function adjusting element same as that contained in the P-type transistor 202, formed between the high-k gate insulating film 108 and the gate electrode (TiN film 110). In short, in the semiconductor device 400 of this embodiment, the N-type transistor 200 has the silicon oxide film (Al-added $SiO_2$ film 129b) or the silicon oxynitride film, which contains Al as the second work function adjusting element, formed between the high-k gate insulating film 108 and the gate electrode (TiN film 110). In this embodiment, the same and a single species of second work function adjusting element is used both for the P-channel region 104 and the N-channel region 105.

The present inventors found out from our investigations that the range of modulation of the effective work function of the N-type transistor 200 may be reduced, by using the second work function adjusting element for the P-type transistor 202, if the position of introduction and mode of existence of the work function adjusting element are appropriately selected. Accordingly, by adopting a configuration in which the $SiO_2$ film or the SiON film, added with the conventional work function adjusting element for PMOS such as Al, is formed over the surface of the high-k gate insulating film 108 in the N-channel region 105, and the $SiO_2$ film or the SiON film, added with the conventional work function adjusting element for PMOS such as Al, is formed at the interface between the high-k gate insulating film 108 and the silicon substrate 101 in the P-channel region 104, it is now possible to induce the interfacial dipole which contributes to increase the effective work function of the gate electrode in the P-channel region 104, while inducing the interfacial dipole which contributes to decrease the effective work function of the gate electrode in the N-channel region 105.

Next, a method of manufacturing according the third embodiment will be explained.

FIGS. 18 to 24 are sectional views for explaining the method of manufacturing a semiconductor device according to the third embodiment, taken along the length of channel of MOSFET.

The method of manufacturing a semiconductor device of this embodiment has a step of forming, in the P-channel region 104 of the substrate (silicon substrate 101) having the N-channel region 105 and the P-channel region 104 formed therein, the silicon oxide film (Al-added $SiO_2$ film 129a) or silicon oxynitride film which contains the second work function adjusting element, the Hf-containing, high-k gate insulating film 108, and the gate electrode (TiN film 110), and on the other hand, forming, in the N-channel region 105 of the substrate, the Hf-containing, high-k gate insulating film 108, the silicon oxide film (Al-added $SiO_2$ film 129b) or the silicon oxynitride film which contains the second work function adjusting element same as that used in the P-channel region, and the gate electrode (Si film 111). More specifically, first, the silicon oxide film or silicon oxynitride film which contains the second work function adjusting element, is formed in the P-channel region 104 of the substrate (silicon substrate 101) having the N-channel region 105 and the P-channel region 104 formed therein. Next, the Hf-containing, high-k gate insulating film 108 is formed respectively in the N-channel region 105 and the P-channel region 104. Next, the silicon oxide film or the silicon oxynitride film, which contains the second work function adjusting element same as that contained in the P-channel region 104 is formed over the high-k gate insulating film 108 in the N-channel region 105. Next, the gate electrode (TiN film 110) is formed respectively in the N-channel region 105 and the P-channel region 104. The method of manufacturing a semiconductor device includes a step of forming, over the high-k gate insulating film 108 in the N-channel region 105, the silicon oxide film or the silicon oxynitride film which contains the second work function adjusting element such as Al.

Figure 18:
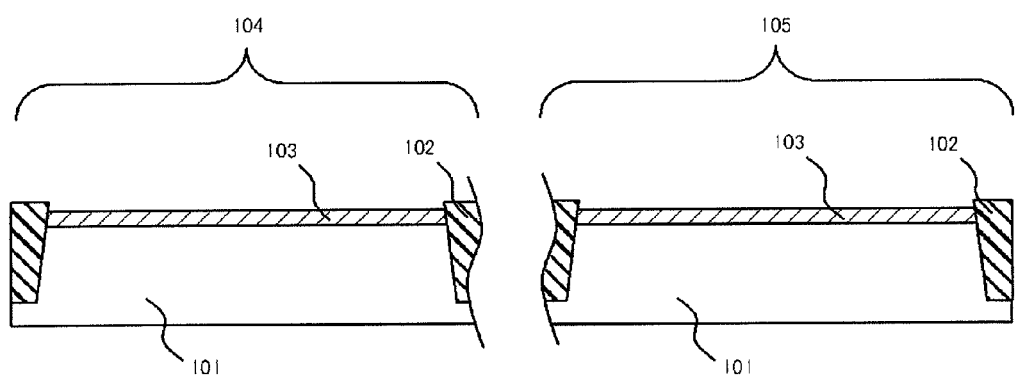
FIGS. 18 to 24 are sectional views sequentially illustrating procedures of manufacturing of a semiconductor device according to a third embodiment of the present invention.

For more details, first, as illustrated in FIG. 18, the device isolation region 102 having STI (Shallow Trench Isolation) structure is formed over the silicon substrate 101 by a publicly-known method. Next, a sacrificial oxide film 103 is grown over the surface of the silicon substrate 101, in a device-forming region formed between the device isolation region 102.

Next, boron is introduced into the N-channel region 105, and phosphorus or arsenic is introduced into the P-channel region 104, respectively by ion implantation. By the ion implantation, the ions are introduced through the sacrificial oxide film 103, into the surficial portions of the silicon substrate 101. Next, the sacrificial oxide film 103 is removed, typically by using aqueous $NH_4F$ solution or dilute hydrofluoric acid.

Figure 19:
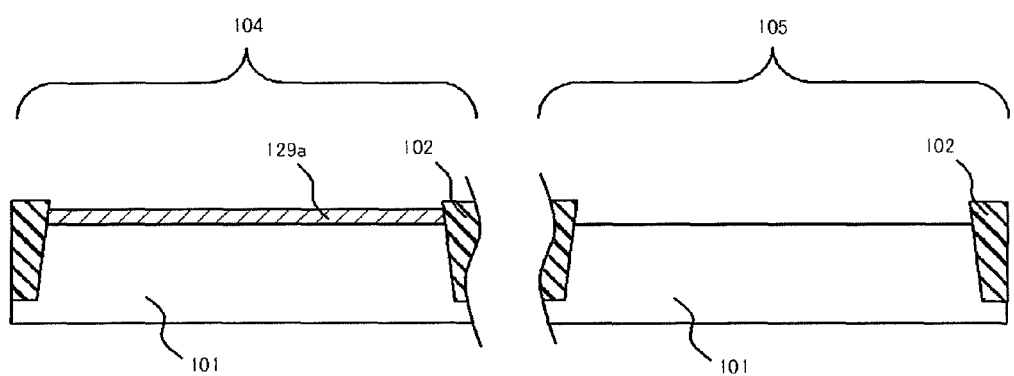

Next, as illustrated in FIG. 19, the silicon oxide film (chemical $SiO_2$ film) or the silicon oxynitride film (SiON film) is formed selectively in the P-channel region 104. In this embodiment, the silicon oxide film is formed. The silicon oxide film may be formed by annealing. A metal film which contains the work function adjusting element for PMOS is then formed over the silicon oxide film, by CVD or PVD (Physical Vapor Deposition). In this embodiment, $Al_2O_3$ (aluminum oxide) film is used as the metal film. The obtained article is then annealed, so as to diffuse the work function adjusting element contained in the metal film into the silicon oxide film. In this way, the Al-added $SiO_2$ film 129a is formed over the silicon substrate 101 in the P-channel region 104. An excessive portion of the $Al_2O_3$ film is then removed.

Figure 20:
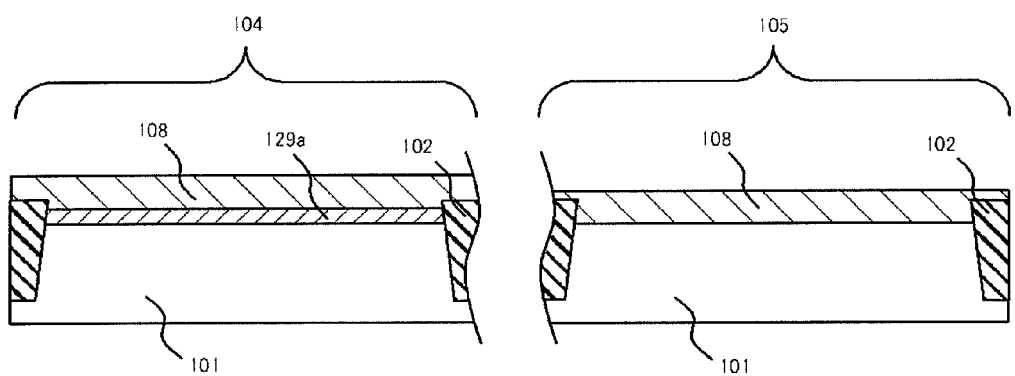

Next, as illustrated in FIG. 20, the high-k gate insulating film 108 is formed over the Al-added $SiO_2$ film 129a, similarly as previously illustrated in FIG. 3.

Alternatively, the high-k gate insulating film 108 in the N-channel region 105 may be added with nitrogen typically by nitrogen plasma irradiation or nitrogen ion implantation, after forming an unillustrated resist mask over the high-k gate insulating film 108 in the P-channel region 104. In this way, nitrogen concentration of the high-k gate insulating film 108 in the N-channel region 105 may be set higher than that in the P-channel region 104. The resist mask is then removed. In this embodiment, the concentration may be expressed by atomic concentration.

Figure 21:
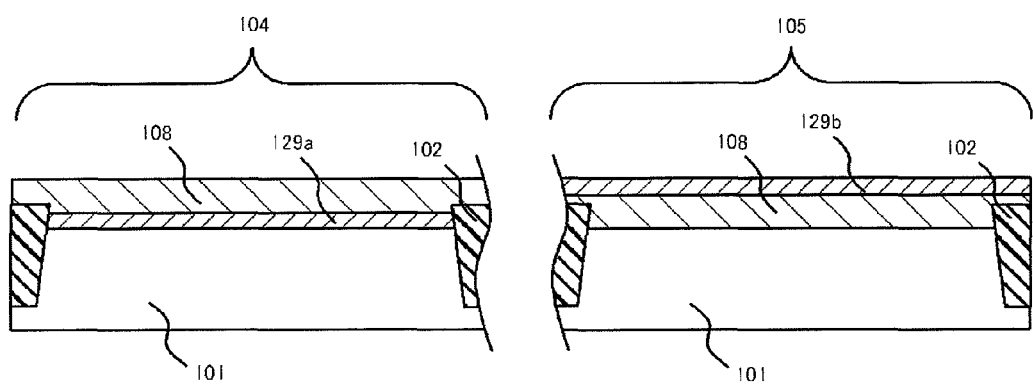

Next, as illustrated in FIG. 21, the silicon oxide film or the silicon oxynitride film is formed selectively over the high-k gate insulating film 108 in the N-channel region 105. In this embodiment, the silicon oxide film is used. A metal film which contains the work function adjusting element for PMOS is then formed over the silicon oxide film, by CVD or PVD. In this embodiment, an $Al_2O_3$ (aluminum oxide) film is used as the metal film. The obtained article is then annealed, so as to diffuse the work function adjusting element contained in the metal film into the silicon oxide film. In this way, the Al-added SiO$_2$ film 129b is formed over the high-k gate insulating film 108 in the N-channel region 105. An excessive portion of the Al$_2$O$_3$ film is then removed.

Figure 22:
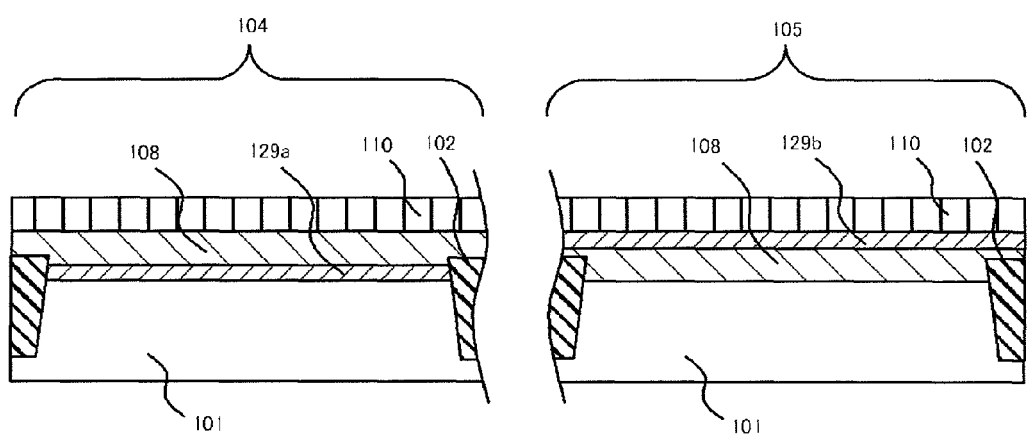

Next, as illustrated in FIG. 22, the TiN film 110 is formed respectively over the high-k gate insulating film 108 in the P-channel region 104, and over the Al-added SiO$_2$ film 129b in the and N-channel region 105.

Figure 23:
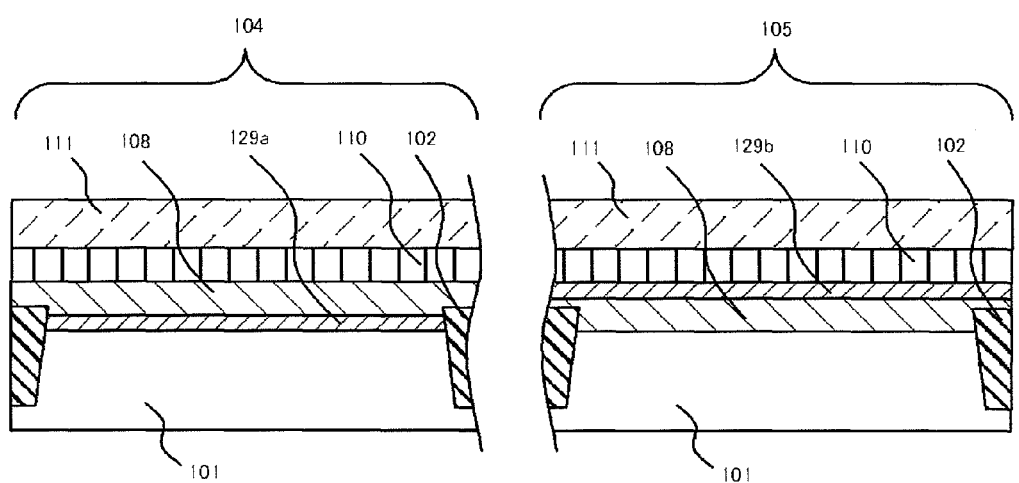
Figure 24:
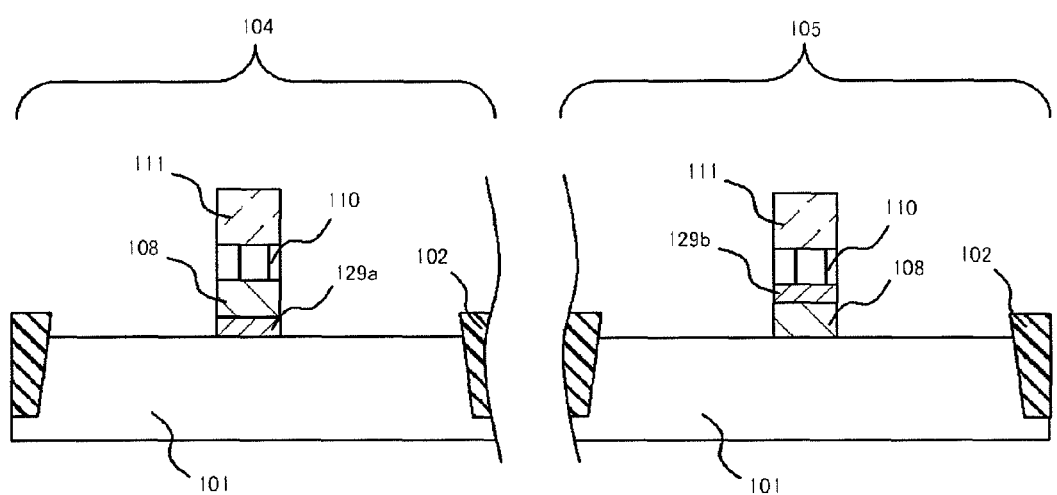

Next, as illustrated in FIG. 23, the Si film 111 is formed over the entire surface of the TiN film 110. Next, as illustrated in FIG. 24, the Si film 111 and the TiN film 110 are patterned by RIE, using an unillustrated hard mask. The underlying Al-added SiO$_2$ film 129a, the Al-added SiO$_2$ film 129b, and the high-k gate insulating film 108 are further etched into a gate geometry.

Next, offset spacers (not illustrated) are formed typically by depositing an insulating film over the entire surface of the silicon substrate 101 typically by CVD, and then by anisotropically etching the insulating film by RIE. The offset spacers may be configured by the silicon oxide film or the silicon oxynitride film, for example. Thereafter, the sidewall spacers are formed by depositing another insulating film over the entire surface of the silicon substrate 101 typically by CVD, and then by anisotropically etching the insulating film by RIE. The sidewall spacers may be configured by the silicon oxynitride film or the silicon oxide film.

Next, the P-type source/drain diffusion layer 113 is formed by introducing boron by ion implantation into the P-channel region 104, while using an unillustrated resist mask which covers the N-channel region 105. The resist mask is then removed. Similarly, the N-type source/drain diffusion layer 114 is formed by introducing phosphorus or arsenic by ion implantation into the N-channel region 105, while using an unillustrated resist mask which covers the P-channel region 104. The resist mask is then removed. The obtained article is annealed.

Next, the unillustrated sidewall spacers are removed, boron is introduced by ion implantation into the P-channel region 104 using an unillustrated resist mask, so as to form the P-type extension diffusion layer 115, and the resist mask is removed. Similarly, phosphorus or arsenic is introduced by ion implantation into the N-channel region 105 using an unillustrated resist mask, so as to form the N-type extension diffusion layer 116. The obtained article is then annealed.

Note that annealing for forming the Al-added SiO$_2$ film 129b is not specifically limited, and may be any of the annealing processes carried out after the aluminum oxide film is formed. Alternatively, an additional annealing process optimized for forming the Al-added SiO$_2$ film 129b may be carried out.

The double-layered sidewall spacers, composed of the offset spacers 118 (SiO$_2$ film) and the sidewall spacers 119 (silicon oxynitride film) are then formed by CVD and RIE. A silicide film 120 is then formed on the surficial portions of the P-type extension diffusion layer 115, the N-type extension diffusion layer 116 and the Si film 111 in a self-aligned manner, by a publicly-known SALICIDE process. In this way, the semiconductor device 400 of this embodiment, illustrated in FIG. 25, may be obtained. As a consequence, as illustrated in FIG. 25, the gate electrodes respectively having a silicide/Si/metal gate stacked structure may be formed in the N-type transistor 200 and in the P-type transistor 202.

The above-described process is followed by formation of an insulating interlayer, formation and filling of contact holes, formation of interconnects and so forth, similarly to those adopted to conventional transistor processes, thereby the semiconductor integrated circuit having CMOS FET may be formed.

In this embodiment, position of placement of the silicon oxide film or the silicon oxynitride film, which contains the work function adjusting element such as Al, is varied between the P-type transistor 202 and the N-type transistor 200, so that the effective work function of the N-type transistor 200 may be lowered while increasing the effective work unction of the P-type transistor 202, despite only a single species of work function adjusting element is used. More specifically, the Al-added SiO$_2$ film is inserted at the interface between the TiN film 110 (gate electrode) and the high-k gate insulating film 108 in the N-type transistor 200, whereas at the interface between the high-k gate insulating film 108 and the substrate (silicon substrate 101) in the P-type transistor 202, so as to independently adjust V$_{th}$ for the NMOS and PMOS regions. As a consequence, according to this embodiment, the P-type transistor 202 and the N-type transistor 200 may be formed in a respectively optimized manner in the P-channel region 104 and the N-channel region 105, by using the same and a single species of work function adjusting element, but varying the position of placement. Accordingly, the processes may be simplified, the cost may be saved, and the productivity may be improved.

Fourth Embodiment

A semiconductor device of the fourth embodiment will be explained.

Figure 34:
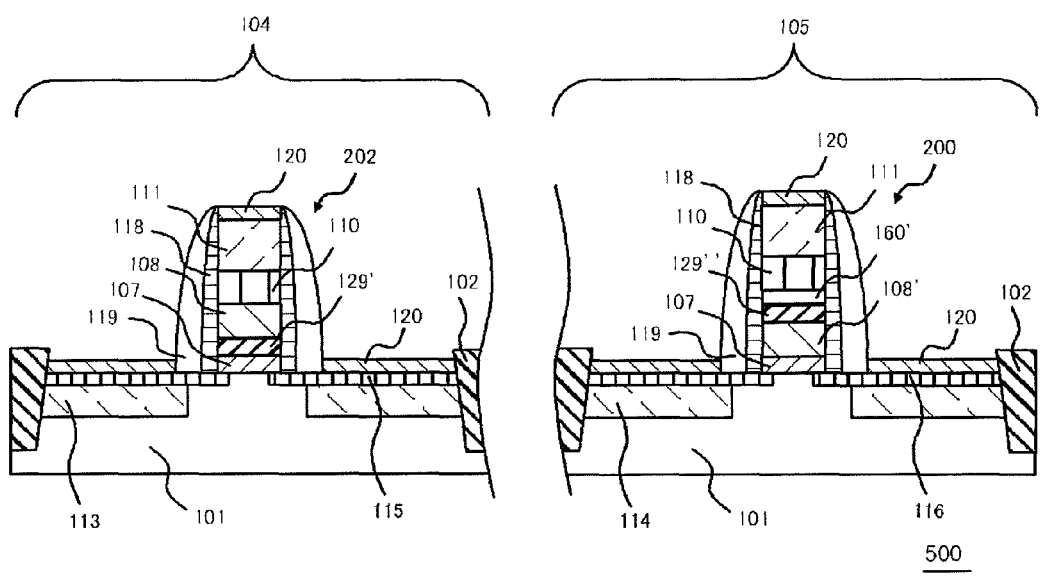
FIG. 34 is a sectional view illustrating the semiconductor device of the fourth embodiment.

FIG. 34 is a sectional view illustrating a semiconductor device of the fourth embodiment, taken along the length of channel of MOSFET.

A semiconductor device 500 of the fourth embodiment has the P-type transistor 202 and the N-type transistor 200. The N-type transistor 200 has the chemical oxide film 107 formed over the silicon substrate 101, the high-k gate insulating film 108' formed over the chemical oxide film 107, and the TiN film 110 and the silicide film 120 formed above the high-k gate insulating film 108'. Between the high-k gate insulating film 108' and the TiN film 110, an Al-added SiO$_2$ film 129" and the SiO$_2$ film 160' are formed in this order.

On the other hand, the P-type transistor 202 has the chemical oxide film 107 formed over the silicon substrate 101, the high-k gate insulating film 108 formed above the chemical oxide film 107, and the TiN film 110 and the silicide film 120 formed above the high-k gate insulating film 108. Between the chemical oxide film 107 over the silicon substrate 101 and the high-k gate insulating film 108, an Al-added SiO$_2$ film 129' is formed.

Next, a method of manufacturing a semiconductor device of the fourth embodiment will be explained.

FIGS. 26 to 33 are sectional views for explaining the method of manufacturing a semiconductor device according to the fourth embodiment.

The method of manufacturing the semiconductor device 500 according to the fourth embodiment is similar to that of the third embodiment, except that a step for diffusing the work function adjusting element is carried at the same time both in the P-channel region 104 and the N-channel region 105. More specifically, the method of manufacturing the semiconductor device 500 according to the fourth embodiment includes the steps below. First, the chemical oxide film 107 or the silicon oxynitride film is formed in the N-channel region 105 and in the P-channel region 104 of the substrate (silicon substrate 101) having these regions formed therein. Next, in the N-channel region 105 and in the P-channel region 104, the high-k gate insulating film 108 is formed. Next, an element capable of suppressing the second work function adjusting element from diffusing is selectively introduced into the high-k gate insulating film 108 in the N-channel region 105, using the patterned resist mask 130. Next, a film ($Al_2O_3$ film 151) which contains a work function adjusting element is formed over the high-k gate insulating film 108 both in the N-channel region 105 and P-channel region 104. Next, the silicon oxide film ($SiO_2$ film 160) or the silicon oxynitride film is formed over the $Al_2O_3$ film 151 in the N-channel region 105. The obtained article is then annealed. Next, the gate electrodes (TiN film 110) are formed respectively in the P-channel region 104 and in the N-channel region 105. The obtained article is then annealed. The semiconductor device 500 thus obtained in this embodiment has the silicon oxide film (Al-added $SiO_2$ film 129') or the silicon oxynitride film, which contains the work function adjusting element, formed between the silicon substrate 101 and the high-k gate insulating film 108 in the P-channel region 104, and has the silicon oxide film (Al-added $SiO_2$ film 129") or the silicon oxynitride film, which contains the work function adjusting element, formed between the high-k gate insulating film 108 and the TiN film 110 in the N-channel region 105.

Figure 26:
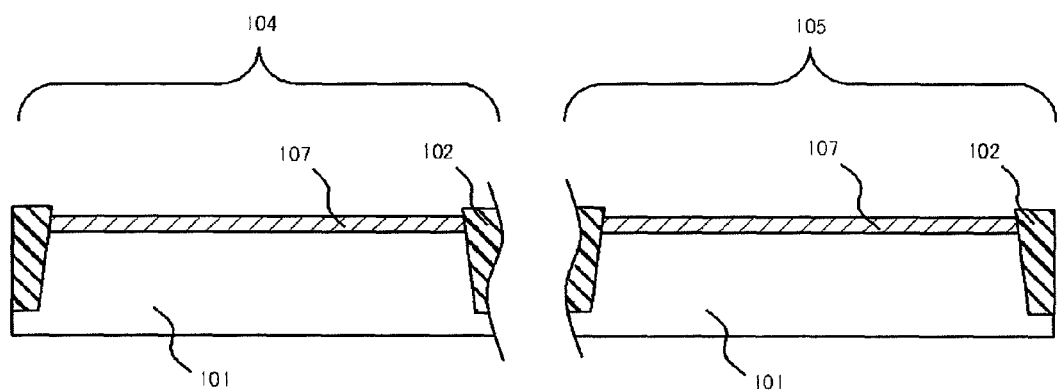
FIGS. 26 to 33 are sectional views sequentially illustrating procedures of manufacturing of a semiconductor device according to a fourth embodiment of the present invention.

For more details, first, as illustrated in FIG. 26, the P-channel region 104 and the N-channel region 105 are formed. Thereafter, as illustrated in FIG. 26, the chemical oxide film 107 (chemical $SiO_2$ film) is formed over the silicon substrate 101 both in the P-channel region 104 and N-channel region 105. The chemical oxide film 107 may be formed by a method similar to that described in the above. Alternatively, a silicon oxynitride film may be formed in place of the chemical oxide film 107.

Figure 27:
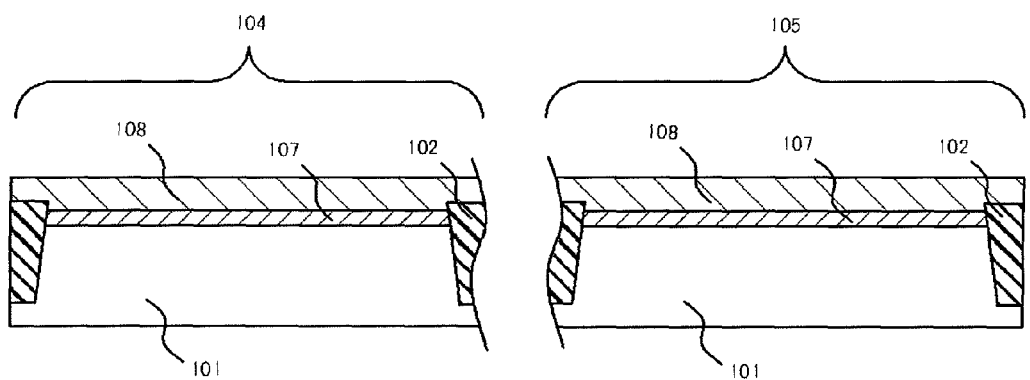

Next, an unillustrated HfSiO film (hafnium silicate film) is formed over the entire surface of the chemical oxide film 107, by MOCVD. The HfSiO film is subjected to plasma treatment in a nitrogen atmosphere, and then annealed. In this way, the HfSiO film is modified to configure the high-k gate insulating film 108 (HfSiON film) (FIG. 27).

Figure 28:
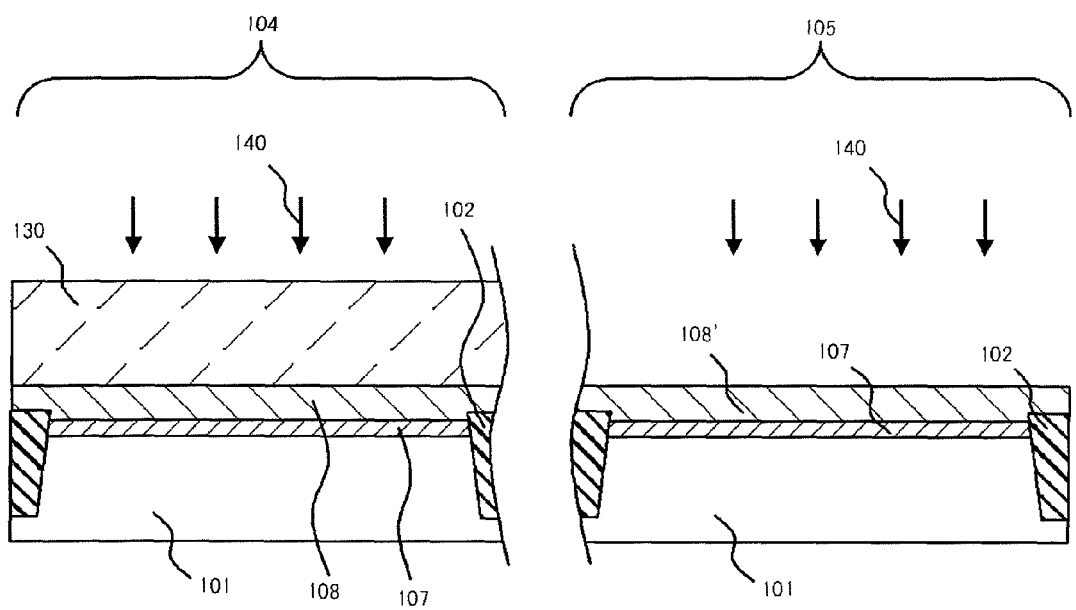

Next, as illustrated in FIG. 28, the patterned resist mask 130 which exposes the N-channel region 105 is formed. Next, using the resist mask 130 thus formed so as to cover the P-channel region 104, nitrogen is introduced into the high-k gate insulating film 108 in the N-channel region 105, by irradiating nitrogen plasma 140 or nitrogen ion implantation, so as to modify the film into the nitrogen-added, high-k gate insulating film 108'. In this way, the high-k gate insulating film 108' in the N-channel region 105 has a nitrogen concentration larger than that of the high-k gate insulating film 108 in the P-channel region 104. The resist mask 130 is then removed.

Figure 29:
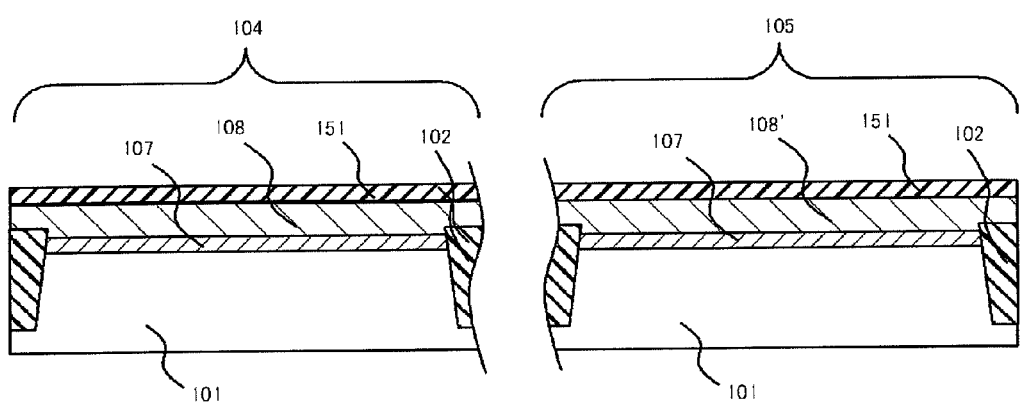

Next, as illustrated in FIG. 29, the $Al_2O_3$ film 151 (oxide film containing the work function adjusting element) is deposited over the entire surface of the high-k gate insulating film 108 in the P-channel region 104, and over the entire surface of the high-k gate insulating film 108' in the N-channel region 105. In other words, the $Al_2O_3$ film 151 is formed in both of the P-channel region 104 and the N-channel region 105 by a single process. The $Al_2O_3$ film 151 is formed typically by PVD. Thickness of the $Al_2O_3$ film 151 is typically adjusted to 1 nm or smaller.

Figure 30:
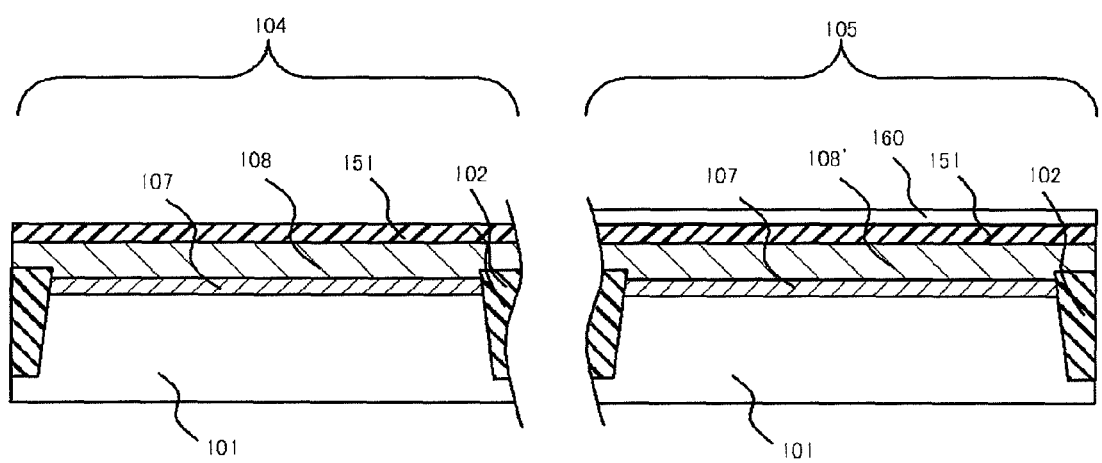

Next, as illustrated in FIG. 30, the $SiO_2$ film 160 is selectively formed only over the $Al_2O_3$ film 151 in the N-channel region 105. The $SiO_2$ film 160 is formed by PVD or CVD. Thickness of the $SiO_2$ film 160 is adjusted to 1 nm or smaller. Alternatively, a SiON film may be used in place of the $SiO_2$ film 160.

Figure 31:
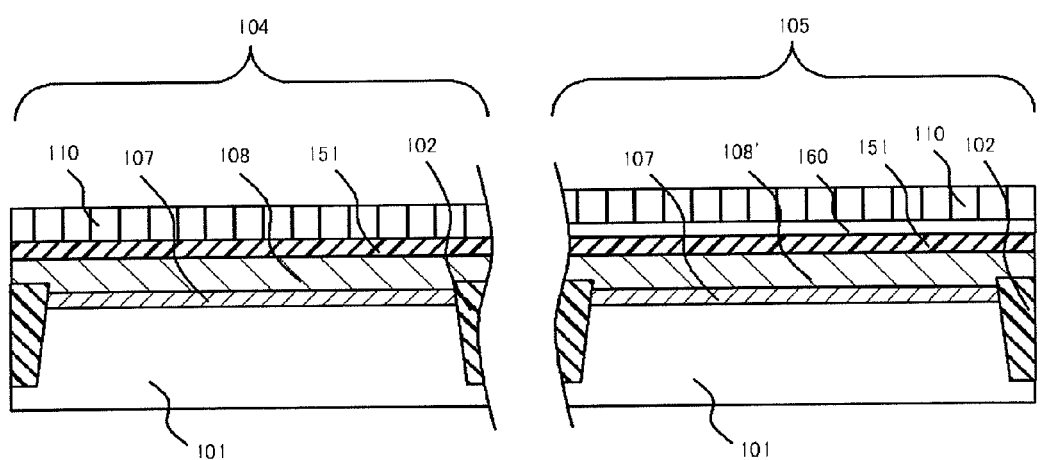

Next, as illustrated in FIG. 31, the TiN film 110 is formed over the $SiO_2$ film 160 in the N-channel region 105, and over the $Al_2O_3$ film 151 in the P-channel region 104. The TiN film 110 is formed typically by sputtering using a TiN target, reactive sputtering by which the TiN film is formed by sputtering a Ti target in a nitrogen atmosphere, CVD, or ALD.

Figure 32:
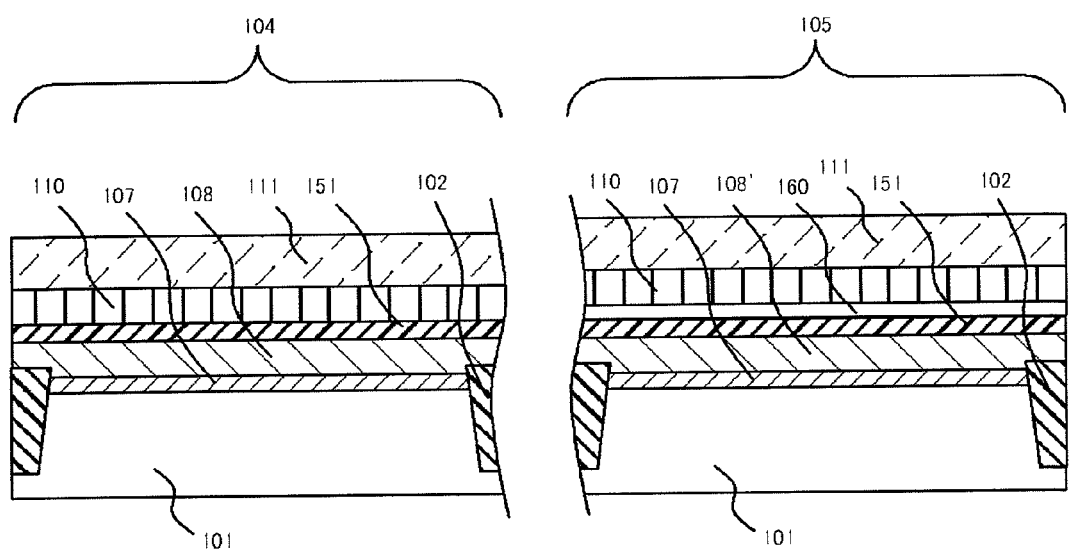
Figure 33:
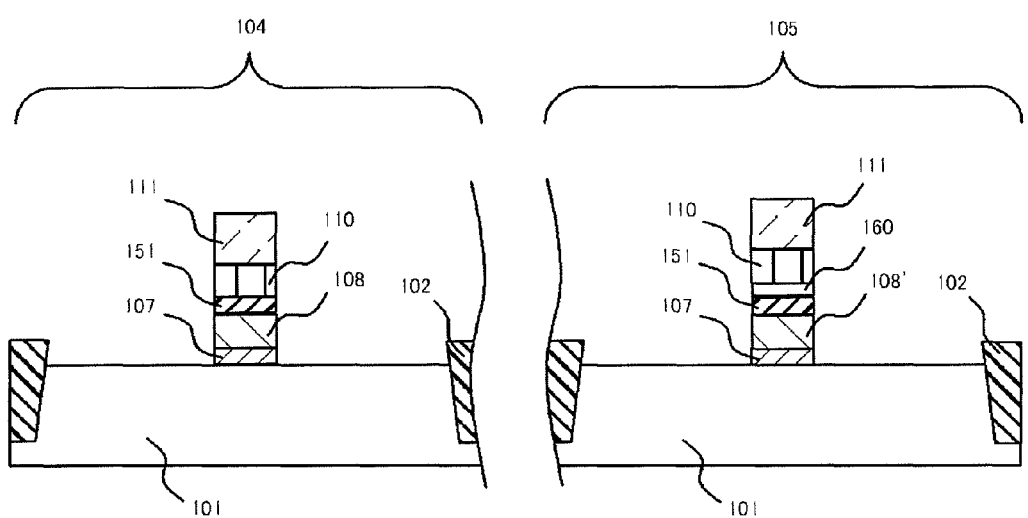

Next, as illustrated in FIG. 32, the Si film 111 is formed over the entire surface of the TiN film 110. Next, as illustrated in FIG. 33, the Si film 111 and the TiN film 110 are etched by RIE using an unillustrated hard mask. The underlying $Al_2O_3$ film 151, the high-k gate insulating films 108, 108', the chemical oxide film 107, and the $SiO_2$ film 160 are then etched.

Thereafter, a CMOS FET as illustrated in FIG. 34 is obtained by processes similar to those described referring to FIG. 25.

Note that, in the process of annealing for forming the poly silicon (Si film 111) and extension diffusion layers 115, 116 in the method of manufacturing according to the fourth embodiment, Al composing the $Al_2O_3$ film 151 in the P-channel region 104 diffuses towards the interface between the chemical oxide film 107 and the high-k gate insulating film 108. A final structure obtainable herein is such as having the Al-added $SiO_2$ film 129' (or Al-added SiON film) formed between the chemical oxide film 107 and the high-k gate insulating film 108.

On the other hand, in the N-channel region 105, Al composing the $Al_2O_3$ film 151 in the N-channel region 105 reacts with a part (lower layer) of the $SiO_2$ film 160 (or SiON film) formed over the surface of the high-k gate insulating film 108', to thereby form the Al-added $SiO_2$ film 129" (or Al-added SiON film), by similar annealing. Since the high-k gate insulating film 108' has a high nitrogen concentration, Al is suppressed from diffusing into the high-k gate insulating film 108'. Accordingly, Al remains over the high-k gate insulating film 108', without diffusing into the high-k gate insulating film 108'. The residual portion (upper layer) of the $SiO_2$ film 160 (SiON film), left unreacted with the $Al_2O_3$ film 151, remains as the $SiO_2$ film 160' (or SiON film).

In the N-channel region 105 of the CMOS FET of the fourth embodiment, the Al-added $SiO_2$ film 129" (Al-added SiON film) resides only between the TiN electrode (TiN film 110) and the high-k gate insulating film 108', but does not resides between the high-k gate insulating film 108' and the silicon substrate 101. On the other hand, in the P-channel region 104, the Al-added $SiO_2$ film 129' (or Al-added SiON film) resides between the high-k gate insulating film 108 and the silicon substrate 101. By virtue of this configuration, electric dipole capable of varying the effective work function of the TiN electrode reversely in the P-channel and N-channel regions is induced, even if the same species of the work function adjusting element is used for both regions. As a consequence, in the fourth embodiment, $V_{th}$ may optimally be adjustable both for the P-channel region 104 and the N-channel region 105, by controlling the position of residence of a single species of work function adjusting element in the stacked structure of the gate.

In the fourth embodiment, a step of forming the metal film which contains a work function adjusting element (for example, $Al_2O_3$ film 151), and a step of diffusing Al in the $Al_2O_3$ film 151 may commonly (equally) be carried out both for the P-channel region 104 and the N-channel region 105. Accordingly, the processes may be simplified and the cost may be saved. The fourth embodiment gives effects same as those in the third embodiment.

The present invention is not limited to the above-described embodiments. For example, although the extension diffusion layers in the above-described embodiments were formed after the source/drain diffusion layers were formed, and after the sidewall spacers were removed, another possible process may be such as forming the extension diffusion layers immediately after the offset spacer were formed, followed by formation of the sidewall spaces, and formation of the source/drain diffusion layers.

The present invention is not straightly limited to the above-described embodiments, while allowing various modifications of the constituents when the present invention is embodied, without departing from the spirit thereof. In addition, various inventions may be created by appropriately combining a plurality of constituents disclosed in the above-described embodiments. For example, some constituents may be omitted from the entire constituents described in the embodiment. Still alternatively, the constituents described in the separate embodiments may appropriately be combined.

It is apparent that the present invention is not limited to the above embodiments, that may be modified and changed without departing from the scope and spirit of the invention.

What is claimed is:

1. A method of manufacturing a semiconductor device, the method comprising:
    forming, in an N-channel region of a substrate, the substrate having the N-channel region and a P-channel region formed thereon, a silicon oxide film or a silicon oxynitride film which contains a first work function adjusting element, a Hf-containing, high-k gate insulating film, and a gate electrode; as well as forming, in the P-channel region of the substrate, a Hf-containing, high-k gate insulating film, a silicon oxide film or a silicon oxynitride film which contains a same first work function adjusting element as the first work function adjusting element that is used in the N-channel region, and a gate electrode,
    wherein, in the N-channel region, the silicon oxide film or the silicon oxynitride film, the high-k gate insulating film, and the gate electrode are arranged in this order from the substrate,
    wherein, in the P-channel region, the high-k gate insulating film, the silicon oxide film or the silicon oxynitride film, and the gate electrode are arranged in this order from the substrate, and
    wherein the high-k gate insulating film of the P-channel region contains a same composition as the high-k gate insulating film that is used in the N-channel region.

2. The method of manufacturing a semiconductor device according to claim 1, comprising:
    forming the silicon oxide film or the silicon oxynitride film which contains the first work function adjusting element, in the N-channel region of the substrate, the substrate having the N-channel region and the P-channel region formed thereon;
    forming the Hf-containing, high-k gate insulating film in the N-channel region and in the P-channel region;
    forming the silicon oxide film or the silicon oxynitride film which contains the first work function adjusting element same as that used in the N-channel region, over the high-k gate insulating film in the P-channel region; and
    forming the gate electrodes respectively in the N-channel region and in the P-channel region.

3. The method of manufacturing a semiconductor device according to claim 1, comprising:
    forming the silicon oxide film or the silicon oxynitride film, in the N-channel region and in the P-channel region of the substrate having the N-channel region and the P-channel region formed therein;
    forming the high-k gate insulating film in the N-channel region and in the P-channel region;
    selectively introducing a diffusion-suppressive element capable of suppressing the first work function adjusting element from diffusing, into the high-k gate insulating film in the P-channel region, using a resist mask;
    forming a film containing the first work function adjusting element, over the high-k gate insulating film which is formed in the N-channel region and in the P-channel region;
    forming the silicon oxide film or the silicon oxynitride film, over the film containing the first work function adjusting element which is formed in the P-channel region;
    annealing the thus-obtained article; and
    forming the gate electrodes respectively in the N-channel region and in the P-channel region.

4. The method of manufacturing a semiconductor device according to claim 1,
    wherein the first work function adjusting element comprises at least one element selected from the group consisting of La, Y and Mg.

5. The method of manufacturing a semiconductor device according to claim 3, wherein the diffusion-suppressive element is nitrogen.

6. The method of manufacturing a semiconductor device according to claim 1, wherein the high-k gate insulating film is a HfSiON film or a HfON film.

7. The method of manufacturing a semiconductor device according to claim 1, wherein the gate electrode contains a TiN layer.

8. The method of manufacturing a semiconductor device according to claim 3, wherein the step of selectively introducing the diffusion-suppressive element adopts plasma irradiation or ion implantation.

* * * * *